United States Patent [19]

Egusa et al.

[11] Patent Number: 5,294,810
[45] Date of Patent: Mar. 15, 1994

[54] ORGANIC ELECTROLUMINESCENT DEVICE

[75] Inventors: Syun Egusa; Nobuhiro Gemma, both of Yokohama, Japan

[73] Assignee: Kabushiki Kaisha Toshiba, Kawasaki, Japan

[21] Appl. No.: 921,379

[22] Filed: Jul. 30, 1992

Related U.S. Application Data

[63] Continuation of Ser. No. 501,251, Mar. 29, 1990, abandoned.

[30] Foreign Application Priority Data

Mar. 31, 1989 [JP] Japan .................................. 1-83568
Sep. 29, 1989 [JP] Japan ................................ 1-254960
Feb. 6, 1990 [JP] Japan .................................. 2-25100
Feb. 6, 1990 [JP] Japan .................................. 2-25101

[51] Int. Cl.$^5$ ...................... H01L 29/28; H01L 33/00
[52] U.S. Cl. ........................... 257/40; 257/97; 257/103
[58] Field of Search ............. 357/8, 17; 257/40, 96, 257/97, 103

[56] References Cited

U.S. PATENT DOCUMENTS

4,757,364  7/1988  Miura et al. .......................... 357/17
5,093,698  3/1992  Egusa .................................. 257/40

FOREIGN PATENT DOCUMENTS

120673  10/1984  European Pat. Off. .
61-44974  3/1986  Japan .

OTHER PUBLICATIONS

Sze, Physics of Semiconductor Devices, 2nd Ed (Wiley, New York, 1981), pp. 708-710.
Applied Physics Letters, vol. 51, Sep. 1987, pp. 913-915, New York, US; C. W. Tang et al.: "Organic electroluminescent diodes".
Japanese Journal of Applied Physics, vol. 27, Feb. 1988, pp. L269-L271; C. Adachi et al.: "Electroluminescence in organic films with three-layer structure".
Applied Physics Letters, vol. 56, Feb. 1990, pp. 799-801, New York, US; C. Adachi et al.: "Blue light-emitting organic electroluminescent devices".
Journal of Applied Physics, vol. 51, Aug, 1980, pp. 4555-4557, New York, US; T. Doi et al.: "Bright dc electroluminescence in ZnSe-ZnS:Mn thin films".
Appl. Phys. Lett., vol. 51, p. 913; C. W. Tang and S. A. Vanslyke; Sep. 21, 1987.
Jap. J. Appl. Phys., vol. 27, L269; C. Adachi, S. Tokito, T. Tsutsui; and S. Saito; Feb. 1988.

*Primary Examiner*—William D. Larkins
*Attorney, Agent, or Firm*—Oblon, Spivak, McClelland, Maier & Neustadt

[57] ABSTRACT

In an organic electroluminescent device including first and second electrodes opposite to each other and a multi-layered body which is sandwiched between these electrodes and consists of a plurality of organic films including a light-emitting layer, a material for each organic film and electrode is selected so that electrons and holes are simultaneously and respectively injected from the first and second electrodes in the multi-layered body when a forward biasing voltage is applied, a large amount of injected electrons and holes are accumulated at the multi-layered body, and these electrons and holes are subjected to radiative recombination at a predetermined threshold voltage.

7 Claims, 20 Drawing Sheets

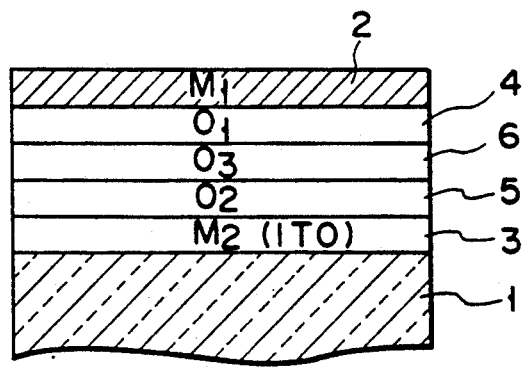
F I G. 1
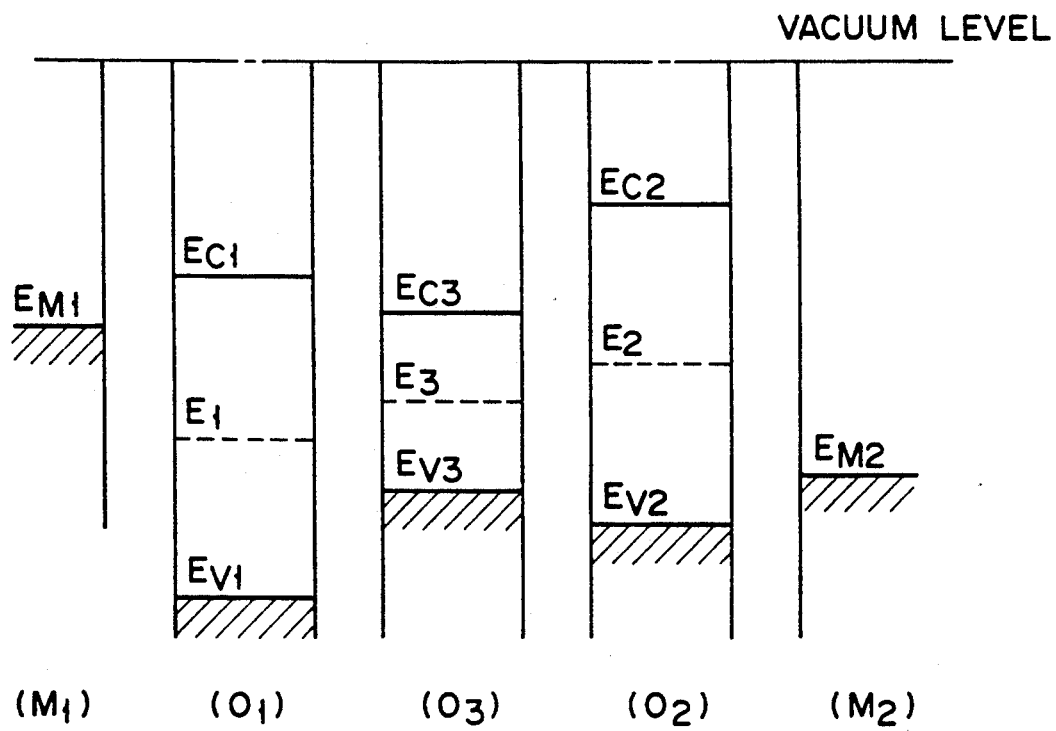
F I G. 2

$(M_1)$ $(O_1)$ $(O_3)$ $(O_2)$ $(M_2)$

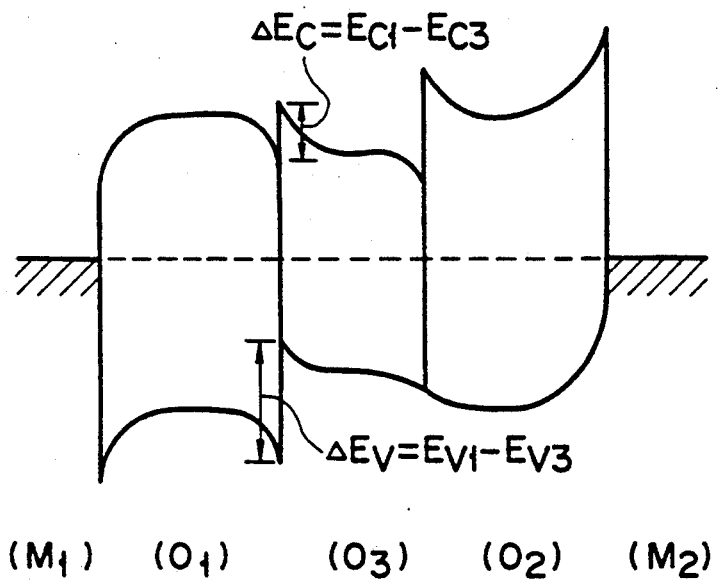
F I G. 5A
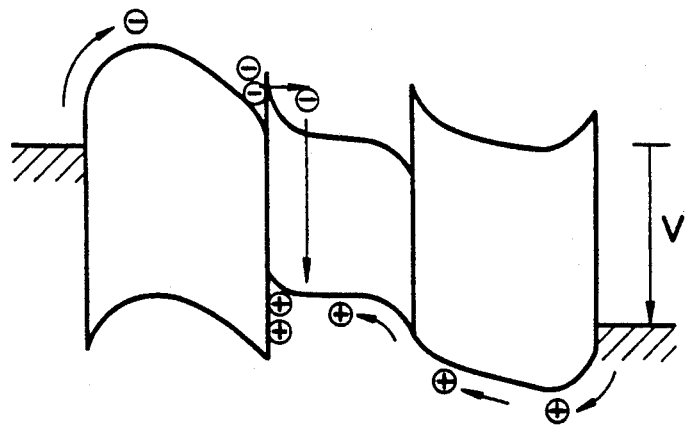
F I G. 5B

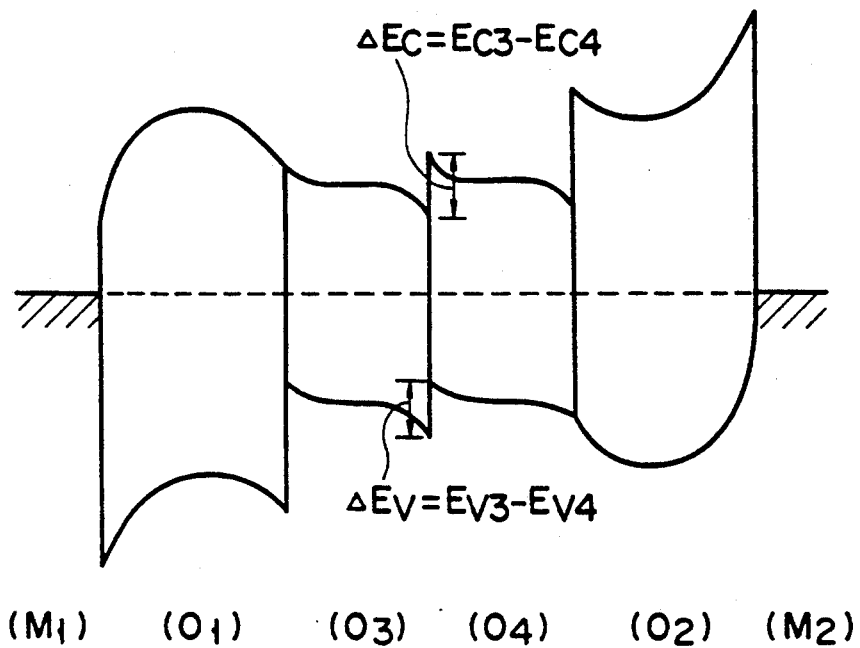
(M₁)    (O₁)    (O₃)    (O₄)    (O₂)    (M₂)
F I G. 10A
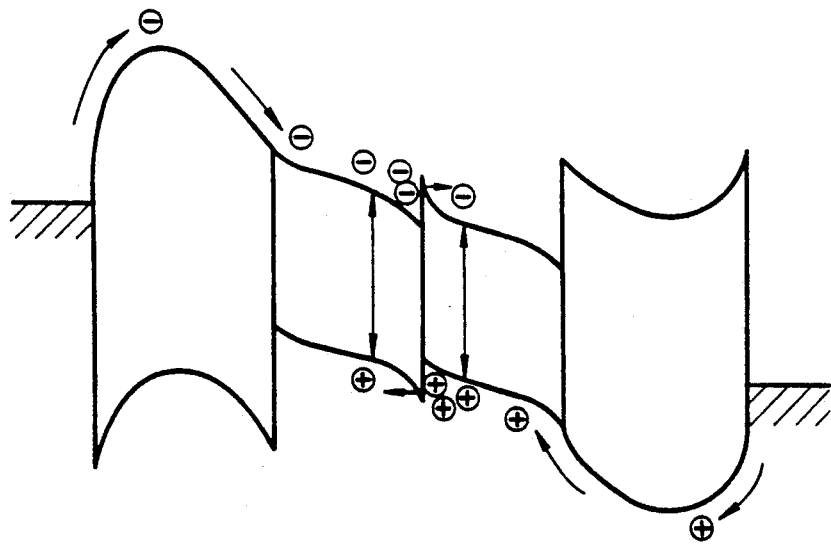
F I G. 10B $vth_1 < v < vth_2$ $v > vth_2$ $vth_1 < v < vth_2$ $v > vth_2$

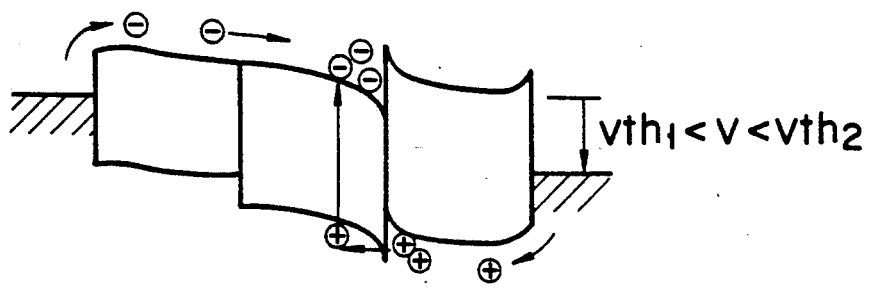
F I G. 24A
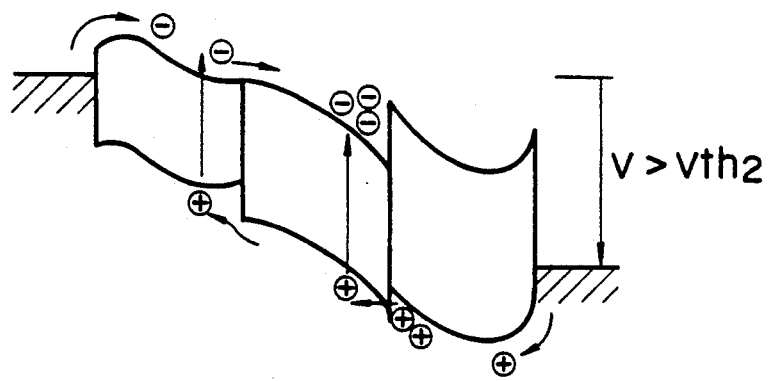
F I G. 24B

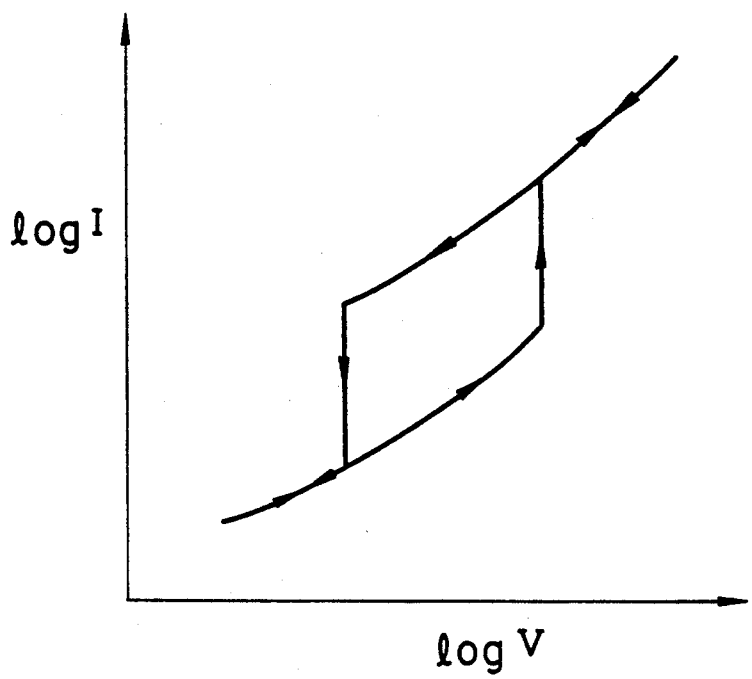
F I G. 25
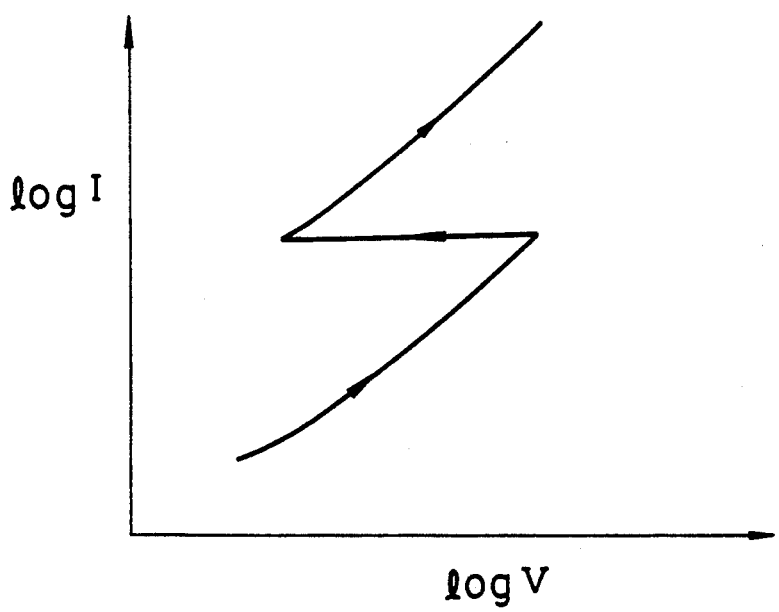
F I G. 26

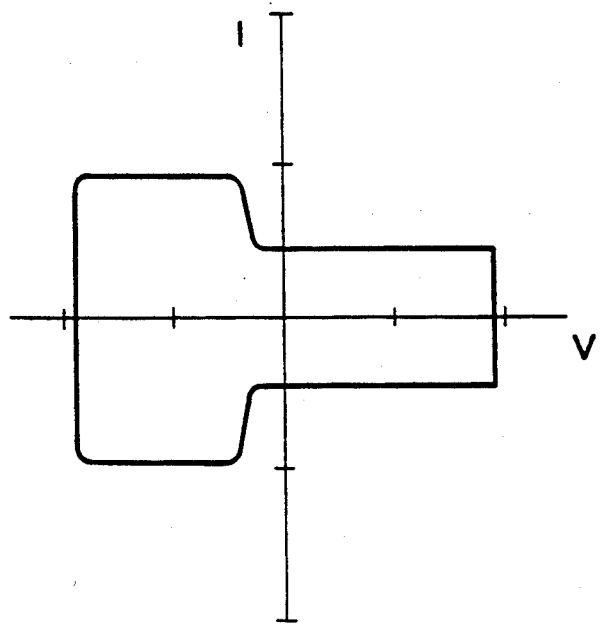
F I G. 34
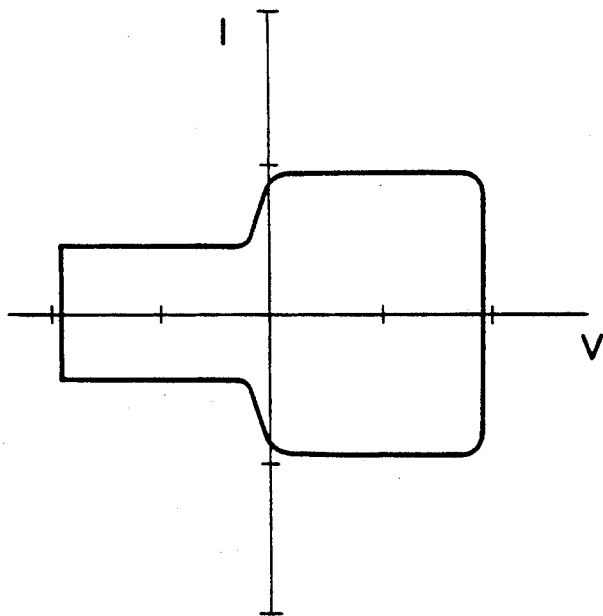
F I G. 35

ORGANIC ELECTROLUMINESCENT DEVICE

This application is a continuation of application Ser. No. 07/501,251, filed on Mar. 29, 1990, now abandoned.

BACKGROUND OF THE INVENTION

1. Field of the Invention

The present invention relates to an electroluminescent device (EL device) using an organic film containing an organic dye and, more particularly, to an organic EL device which is capable of high-efficiency light emission by combining a plurality of organic films.

2. Description of the Related Art

In recent years, an organic EL device used for, e.g., a display or illumination device has been extensively studied and developed. For example, Shogo Saito at Kyushu University reported an EL device with a two-layered structure of organic films using a metal electrode/aromatic dye/polythiophene/transparent electrode (J. J. Appl. Phys. 25, L773, 1986). In this report, the thickness of the organic film is 1 μm or more, and an application voltage is as large as 100 V. In addition, C. W. Tang et al. of Kodak Corp. reported an EL device with a two-layered structure of organic films, i.e., Mg.Ag/Alq3/diamine/ITO (Appl. Phys. Lett., 51, p913, 1987). According to this report, an EL device driven by an application voltage of 10 V or less to exhibit a sufficient luminance for practical use can be obtained by setting the thickness of the organic film to be 1,000 Å or less. Each of these EL devices basically has an organic two-layered structure obtained by combining electron injection type and hole injection type dyes. The principal characteristics of these EL devices are that the thickness of the organic film is decreased as small as possible, that a material having a small work function is selected as a metal electrode on the electron injection side, that an organic material for preventing an electrical defect when an organic film is formed by vacuum evaporation or sublimation is selected, and the like. Shogo Saito at Kyushu University also proposed a device with an organic three-layered structure, i.e., an electron-injection layer/a light-emitting layer/a hole-injection layer. In this structure, when a dye which exhibits a high photoluminescence is selected for the light-emitting layer, high-luminance light emission can be obtained (J. J. Appl. Phys., 27, L269, 1988).

Other reports have also been announced up to the present. For example, some reports are associated with a structure of a light-emitting device obtained by combining various organic films, some report that slight light emission is recognized when a light-emitting agent is mixed with a hole-injection agent even if an organic film has a single-layer structure, and some studies are concerned with degradation of the characteristics of Alq3 serving as a light-emitting member. In addition, many applications for similar studies have been made.

A luminous intensity of an organic EL device has substantially achieved a level of practical use. However, there are many technical problems remaining unsolved in, e.g., the luminous efficiency, the service life, and the manufacturing process of the device. At present, the luminous efficiency is preferably 1%, and normally, about 0.1%. A low luminous efficiency means that a current which does not contribute to light emission flows between electrodes. Since this current generates Joule heat, it is a main cause which decreases the service life of the device. In order to put the organic EL device into practical use, therefore, luminous efficiency is preferably improved to a value from at least several % to about 10%.

In order to improve the luminous efficiency of the organic EL device, the device structure and the electrical properties of a material used for the device must be optimized. So far, the properties of the organic material have been only qualitatively defined. For example, an electron (hole) transportation property, an electron (hole) injection property, a donor type, an acceptor type, and a light-emission property have been defined. Thus, the conditions of the device have been defined insufficiently.

SUMMARY OF THE INVENTION

It is, therefore, an object of the present invention to provide an organic EL device which is capable of high-efficiency light emission by selecting each material such that a large number of electrons and holes are injected and accumulated in a multi-layered structure of organic films in association with the combination of a multi-layered structure of a plurality of organic films and a metal electrode.

Since an organic film is considered as a kind of semiconductor, the electric characteristics of junction between layers determine element characteristics in a device obtained by stacking organic films. More specifically, taking a work function of a metal electrode, a conduction band level, a Fermi level, and a valence band level of each organic film into consideration, the relationship between the energy levels in each junction is important. From such a point of view, the present invention proposes a high-efficiency EL device structure using a semiconductor model.

More specifically, the light-emitting device according to the present invention basically has a structure obtained by sandwiching a multi-layered organic films including a light-emitting layer between first and second electrodes. In such a basic structure, each material is selected to satisfy the following inequalities:

$$E_{M1} < E_1 \tag{1}$$

$$E_2 < E_{M2} \tag{2}$$

$$E_{C1} > E_{C2} \tag{3}$$

$$E_{V1} > E_{V2} \tag{4}$$

where $E_{M1}$ and $E_{M2}$ are the work functions of the first and second electrodes, respectively, $E_{C1}$ is the energy difference (to be referred to as a conduction band level hereinafter) between a vacuum level and the lower end of a conduction band of the first organic film on the first electrode side, $E_1$ is the energy difference (to be referred to as a Fermi level hereinafter) between the vacuum level and a Fermi level, $E_{V1}$ is the energy difference (to be referred to as a valence band level hereinafter) between the vacuum level and the upper end of a valence band, and $E_{C2}$, $E_2$, and $E_{V2}$ are the conduction band level, the Fermi level, and the valence band level of the second organic film on the second electrode side, respectively. In the relationship between the inequalities (1) and (2), $E_{M1} - E_{C1}$ and $E_{V2} - E_{M2}$ are preferably set to be 1 eV or less (more preferably, to be 0.5 to 0.3 eV or less).

When each material which satisfies the above conditional inequalities is selected, a junction can be formed between the first electrode and the first organic film such that electrons are easily injected from the first electrode into the first organic film (conditional inequality (1)). In the junction between the second electrode and the second organic film, holes are easily injected from the second electrode into the second organic film (conditional inequality (2)).

In an EL device which satisfies the above conditions, and which achieves a direct junction between the first and second organic films, a blocking barrier is formed on the junction interface between the first and second organic films to block electrons which flow from the first organic film to the second organic film, and a blocking barrier is formed to block holes which flow from the second organic film to the first organic film. When a biasing voltage is applied between the first and second electrodes of this EL device to set the second electrode at a positive potential with respect to the first electrode, therefore, electrons are injected from the first electrode into the first organic film, and holes are injected from the second electrode into the second organic film. These injected electrons and holes are accumulated at the junction interface between the first and second organic films to form an electric double layer. When the biasing voltage exceeds a given threshold value, electrons are tunnel-injected from the first organic film into the second organic film. If the second organic film serves as an emitting layer, the electrons are recombined with the holes in the second organic film to achieve light emission. If the biasing voltage exceeds another threshold value, holes are tunnel-injected from the second organic film into the first organic film. If the first organic film serves as an emitting layer, the electrons are recombined with the holes in the first organic film to achieve light emission.

The EL device according to the present invention can have a structure which satisfies the conditional inequalities (1) to (4). In this structure, the third organic film with a band gap smaller than those of the first and second organic films is sandwiched therebetween as an emitting layer. The EL device with the above structure can be classified into three types. In the first EL device, the electrons and holes respectively injected from the first and second electrodes into the first and second organic films are further injected into the third organic film, and are confined in the third organic film. In this EL device, the electrons are recombined with the holes in the third organic film to achieve light emission. In the second EL device with a three-layered structure of organic films, each material is selected so that a blocking barrier junction is formed between the third and first organic films to block the flow of electrons from the first organic film to the third organic film, and that a blocking barrier is formed to block the flow of holes from the third organic film to the first organic film. When a biasing voltage is applied to this EL device, the injected electrons and holes are accumulated at the junction interface between the first and third organic films. When the biasing voltage exceeds a given threshold value, electrons are tunnel-injected from the first organic film into the third organic film to perform radiative recombination in the third organic film. In the third EL device with a three-layered structure of organic films, each material is selected so that a blocking barrier junction is formed between the third and second organic films to block the flow of holes from the second organic film to the third organic film, and that a blocking barrier is formed to block the flow of electrons from the third organic film to the first organic film. When a biasing voltage is applied to this EL device, the injected electrons and holes are accumulated at the junction interface between the second and third organic films. When the biasing voltage exceeds a given threshold value, electrons are tunnel-injected from the second organic film into the third organic film to achieve radiative recombination in the third organic film.

As described above, according to the organic EL device of the present invention, an effect of simultaneous injection and accumulation of electrons and holes in an organic film allows high-luminance light emission.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing an organic EL device according to the first embodiment of the present invention;

FIG. 2 is an energy band chart showing the electrical characteristics before junction of each layer of the EL device;

FIG. 5A is an energy band chart showing a thermal equilibrium state of the EL device;

FIG. 5B is an energy band chart showing a biased state of the EL device;

FIG. 10A is an energy band chart showing a thermal equilibrium state of the EL device of FIG. 8;

FIG. 10B is an energy band chart showing a biased state of the EL device;

FIGS. 24A and 24B are energy band charts for explaining a light-emitting operation of the EL device;

FIG. 25 is a graph showing the hysteresis characteristics of the EL device according to the present invention;

FIG. 26 is a graph showing the negative resistance characteristics of the EL device according to the present invention;

FIG. 34 is a graph showing an example of displacement current-voltage characteristics in the device in FIG. 31; and FIG. 35 is a graph showing displacement current-voltage characteristics of the device in FIG. 31.

DETAILED DESCRIPTION OF THE PREFERRED EMBODIMENTS

Figure 3A:
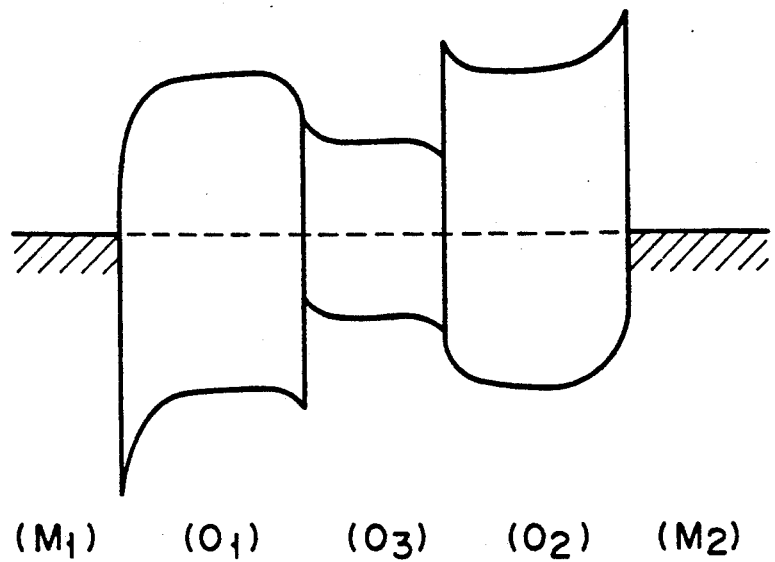
FIG. 3A is an energy band chart showing a thermal equilibrium state of the EL device.

FIG. 1 shows a sectional structure of an organic EL device according to the first embodiment. This EL device can be obtained by sequentially forming films on a glass substrate 1 by, e.g., vacuum evaporation or vacuum sublimation, as will be described later. Three organic films are sandwiched between upper first electrodes ($M_1$) 2 and a lower second electrode ($M_2$) 3. More specifically, a first film ($O_1$) 4 is formed to be in contact with the first electrode 2, and a second organic film ($O_2$) 5 is formed to be in contact with the second electrode 3. A third organic film ($O_3$) 6 serving as a light-emitting layer is sandwiched between the first and second organic films 4 and 5. The second electrode 3 in this embodiment is a transparent electrode of, e.g., ITO formed on the glass substrate 1. Light emitted from the EL device is extracted from the substrate 1 side.

FIG. 2 is an energy band chart in a state wherein layers which constitute the EL device are isolated from each other. As shown in FIG. 2, materials are selected to satisfy the following inequalities:

$$E_{C3} > E_{C1} > E_{C2}$$

$$E_{V1} > E_{V2} > E_{V3}$$

where $E_{C1}$, $E_1$, and $E_{V1}$ are the conduction band level, the Fermi level, and the valence band level of the first organic film ($O_1$) 4, $E_{C2}$, $E_2$, and $EV_2$ are the conduction band level, the Fermi level, and the valence band level of the second organic film ($O_2$) 5, and $E_{C3}$, $E_3$, and $E_{V3}$ are the conduction band level, the Fermi level, and the valence band level of the third organic film ($O_3$) 6. In the first electrode 2, a work function $E_{M1}$ satisfies the following inequality:

$$E_{M1} < E_1$$

More specifically, electrons are easily injected from the first electrode 2 into the first organic film 4. In the second electrode 3, a work function $E_{M2}$ satisfies the following inequality:

$$E_{M2} > E_2$$

More specifically, holes are easily injected from the second electrode 3 into the second organic film 5.

An operation of the EL device according to this embodiment will be described hereinafter with reference to FIGS. 3A and 3B. FIG. 3A is an energy band chart showing the EL device of this embodiment in a thermal equilibrium state. In the thermal equilibrium state, the Fermi levels of the components of the device coincide with each other. In accordance with the difference between the work functions of the electrodes and the energy levels of the organic films shown in FIG. 2, therefore, a junction is formed between the first electrode 2 and the first organic film 4 such that electrons are easily injected from the first electrode 2 into the first organic film 4, as shown in FIG. 3A. A junction is formed between the second electrode 3 and the second organic film 5 such that holes are easily injected from the second electrode 3 into the second organic film 5. The third organic film 6 with a band gap smaller than those of the organic films 4 and 5 is sandwiched between the first and second organic films 4 and 5.

Figure 3B:
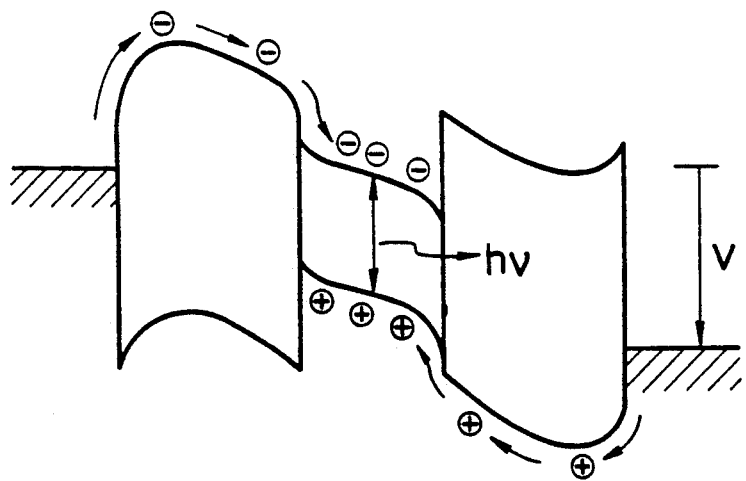
FIG. 3B is an energy band chart showing a biased state of the EL device.

FIG. 3B is an energy band chart of the device obtained when a given positive biasing voltage V with respect to a voltage applied to the first electrode 2 is applied to the second electrode 3. Electrons are injected from the first electrode into the first organic film 4, and holes are injected from the second electrode 3 into the second organic film 5. These injected electrons and holes are trapped in the third organic film 6 serving as a potential well with respect to both the electrons and holes. The electrons and holes trapped in the third organic film 6 are recombined with each other to perform light emission. Since the band gaps of the first and second organic films 4 and 5 are larger than that of the third organic film 6, light emitted from the third organic film 6 is extracted to the outside without being absorbed in the first and second organic films 4 and 5.

Note that when a material which sets a relationship between the energy levels of the junction surfaces is selected in such an EL device of this embodiment, a method for measuring a difference of the energy levels is required. The following method developed by the present inventors may be employed.

Figure 31:
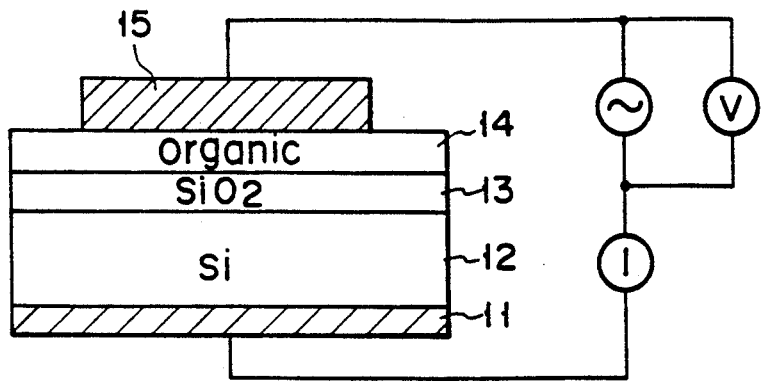
FIG. 31 is a sectional view for explaining a displacement current measuring method to determine the characteristic of the material used in the present invention.
Figure 32:
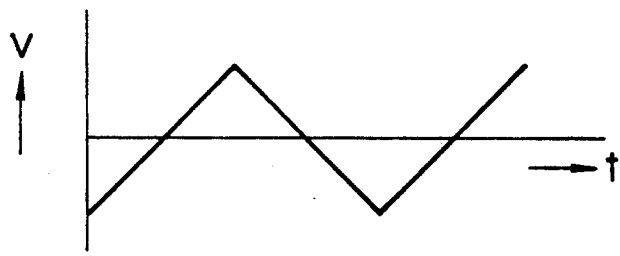
FIG. 32 is a graph showing an application voltage waveform in the method in FIG. 31.

As shown in FIG. 31, a device with a structure of a metal electrode 11/a silicon 12/a silicon oxide film 13/an organic film 14/a metal electrode 15 is formed. A triangular-wave voltage shown in FIG. 32 is applied to this device, and a displacement current of the device at this time is measured. During the measurement, the device is illuminated by a near infra-red ray with a wavelength of 800 nm or more. Thereby, the surface of the silicon 12 is immediately inversed and serves as an electrode like to a metal. The displacement current is defined as:

$$I = C \cdot dV/dt$$

where C is the capacitance of the device. If the organic film 14 is not formed in the device shown in FIG. 31, this device is a known MOS device. The capacitance of this MOS device is determined by the permittivity and thickness of the silicon oxide film 13. In contrast to this, when the organic film 14 is formed, the following displacement current is observed in accordance with the difference between the Fermi level of the organic film 14 and the work function of the metal electrode 15.

(a) When the work function of the metal electrode 15 is substantially equal to the Fermi level of the organic film 14

Figure 33:
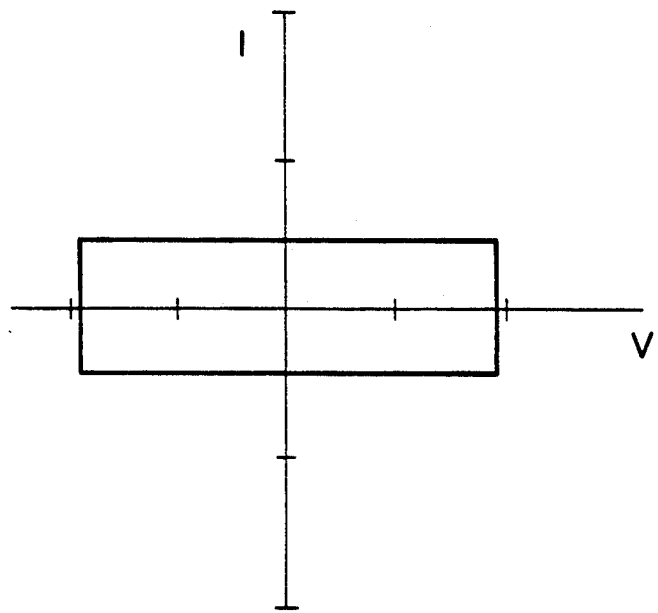
FIG. 33 is a graph showing displacement current-voltage characteristics obtained when an organic film is not formed in FIG. 31.

In this case, the junction between the metal electrode 15 and the organic film 14 has a high blocking barrier with respect to both electrons and holes. Therefore, the organic film 14 serves as an insulating member, and hence the capacitance of the device is a series capacitance of the silicon oxide film and the organic film. This capacitance is constant and smaller than that of a normal MOS device. The displacement current-voltage characteristics obtained when the triangular-wave voltage shown in FIG. 32 is applied to the device exhibit a constant displacement current value regardless of a voltage, as shown in FIG. 33.

(b) When the work function of the metal electrode 15 is smaller than the Fermi level of the organic film 14

In this case, the junction between the metal electrode 15 and the organic film 14 is formed such that electrons are easily injected from the metal electrode 15 into the organic film 14. Therefore, when the triangular-wave voltage shown in FIG. 3 is applied to the device, and the metal electrode 15 is set to be at a negative potential, electrons are injected from the metal electrode 15 into the organic film 14. The injected electrons are accumulated at the interface between the organic film 14 and the oxide film 13. In this state, the capacitance of the device is determined by the oxide film 13. As shown in FIG. 34, therefore, the displacement current is increased up to the level of a normal MOS device. When the application voltage sets the metal electrode 15 at a positive potential, electrons in the organic film 14 flow out toward the metal electrode 15, and the displacement current is decreased to a small value obtained when the organic film 14 serves as an insulating member.

(c) When the work function of the metal electrode 15 is larger than the Fermi level of the organic film 14

In this case, the junction between the metal electrode 15 and the organic film 14 is formed such that holes are easily injected from the metal electrode 15 into the organic film 14. Therefore, when the triangular-wave voltage shown in FIG. 32 is applied to the device, and the metal electrode 15 is set at a positive potential, holes are injected from the metal electrode 15 into the organic film 14. The injected holes are accumulated at the interface between the organic film 14 and the oxide film 13. In this state, the capacitance of the device is determined by the oxide film 13. As shown in FIG. 35, the displacement current is increased up to the level of a normal MOS device. When the application voltage sets the metal electrode 15 at a negative potential, holes in the organic film 14 flow out toward the metal electrode 15, and the displacement current is decreased to a small value obtained when the organic film 14 serves as an insulating member.

Thus, the displacement current of the device shown in FIG. 31 is measured. The junction state between the metal electrode 15 and the organic film 14 is determined depending on whether the measurement result shown in FIG. 33, 34, or 35 is obtained.

The method to examine the relationship between the metal electrode and the organic film has been described above. Then, a similar displacement current measurement is performed with respect to the device obtained by forming a multi-layered structure of the first and second organic films as the organic film 14 in the structure of the device shown in FIG. 31. Upon this measurement, the relationship between the conduction band levels, the Fermi levels, and the valence levels of the two organic films can be apparent.

Assume that, in the structure of the device shown in FIG. 31, the organic film 14 has a two-layered structure, a portion in contact with the metal electrode 15 serves as a first organic film $14_1$, and a portion under the first organic film $14_1$ serves as a second organic film $14_2$. Assume that electrons are injected from the metal electrode 15 into the first organic film $14_1$. This has been already examined in the device having an organic film with a single-layer structure. If a displacement current is supplied to the level of the normal MOS device when the metal electrode 15 is at a negative potential, the electrons injected into the first organic film $14_1$ are further injected into the second organic film $14_2$. Therefore, it is seen that the conduction band level of the second organic film $14_2$ is lower than that of the first organic film $14_1$. If such a MOS device level displacement current is not observed, it is seen that the conduction band level of the second organic film $14_2$ is higher than that of the first organic film $14_1$.

The relationship between the valence band levels of the two organic films can be examined by a similar displacement current measurement utilizing hole injection.

A further detailed embodiment of the organic EL device with the structure shown in FIG. 1 will be described below. The following materials were used in the device shown in FIG. 1.

First Electrode 2: erbium film
Second Electrode 3: ITO film
First Organic Film 4:

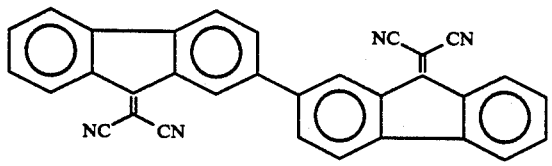

Second Organic Film 5:

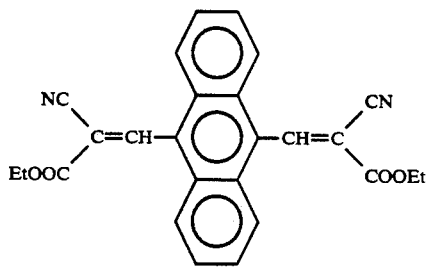

Third Organic Film 6:

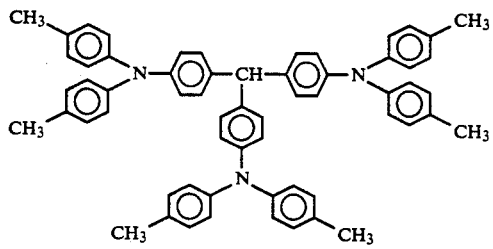

It was confirmed by the above-mentioned displacement current measurement that these material components satisfy the conditions shown in FIG. 2. The process for manufacturing the device is as follows. First, the second organic film 5 is formed on a glass substrate on which an ITO film is formed by vacuum sublimation (vacuum degree: up to $10^{-6}$ torr) to have a thickness of 200 to 1,000 Å. Then, the third and first organic films 6 and 4 are sequentially formed by a similar vacuum sublimation each to have a thickness of 200 to 1000 Å. Finally, an erbium film is formed by vacuum evaporation to have a thickness of 200 to 1,000 Å.

When a biasing voltage was applied to the obtained device to set the ITO electrode at a positive potential, a current of 5 mA was supplied at 10 V, and light emission with a luminance of 1,000 Cd/m$^2$ was recognized. The emission efficiency was about 10%.

For the sake of comparison, an EL device which does not have the first and second organic films 4 and 5, but has the third organic film 6 with a single-layer structure as an emitting layer was manufactured. Even if a current of 100 mA was supplied to the EL device at 20 V, a luminance was 500 Cd/m$^2$, and a emission efficiency was about 0.5%. Therefore, it is seen that trapping of carriers performed by sandwiching the light-emitting layer between the first and second organic films contributes to the improvement in emission efficiency.

Two embodiments using different material components will be described hereinafter on the basis of the structure of the device shown in FIG. 1.

Figure 4:
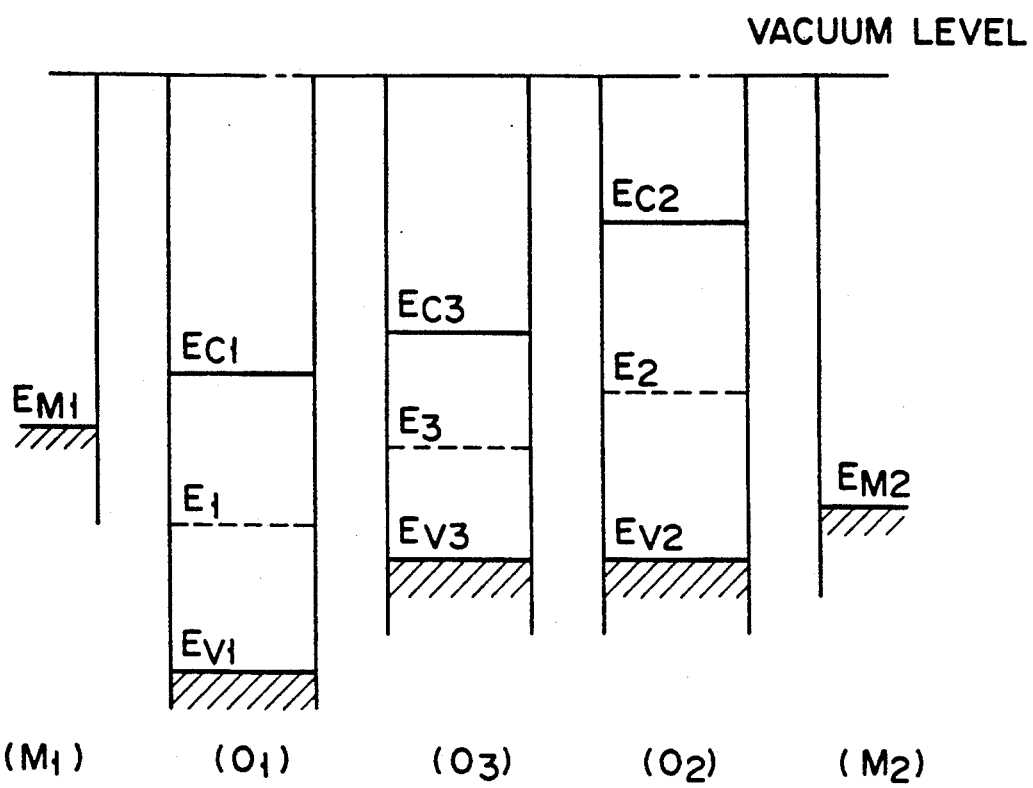
FIG. 4 is an energy band chart showing the electrical characteristics before junction of each layer of an organic EL device according to the second embodiment of the present invention.

FIG. 4 is an energy band chart before junction of the layers of an EL device according to one of the two embodiments. FIG. 4 corresponds to FIG. 2. As is apparent from a comparison with FIG. 2, in this embodiment, the following condition is satisfied between second and third organic films 5 and 6:

$$E_{V2} \sim E_{V3}$$

In addition, the following condition is satisfied between first and third organic films 4 and 6:

$$E_{C1} < E_{C3}$$

The other conditions are the same as those in the above embodiment.

FIGS. 5A and 5B are energy band charts for explaining an operation of an organic EL device of this embodiment. FIG. 5A is an energy band chart in a thermal equilibrium state. As shown in FIG. 5A, in this embodiment, a blocking barrier is formed between the first and third organic films 4 and 6 to block the flow of electrons from the first organic film 4 to the third organic film 6. This blocking barrier is defined as:

$$\Delta E_C = E_{C1} - E_{C3}$$

This blocking barrier which blocks the electrons is smaller than a blocking barrier which blocks the flow of holes from the third organic film 6 to the first organic film 4. This barrier for blocking holes is defined as:
$$\Delta E_V = E_{V1} - E_{V3}$$

A state wherein a forward biasing voltage is applied to the E device of this embodiment is shown in FIG. 5B. Electrons injected from a first electrode 2 into the first organic film 4 are accumulated at the blocking barrier junction between the first and third organic films 4 and 6. The holes injected from a second electrode 3 into the second organic film 5 are supplied to the third organic film 6, and are accumulated at the blocking barrier junction between the third and first organic films 6 and 4. Thus, the carriers accumulated at the junction between the first and third organic films 4 and 6 form an electric double layer. The thickness of the electric double layer is equal to the intermolecule distance (up to 10 Å) of the organic dye. As a result, a high-intensity electric field of about $10^7$ V/cm or more is formed in the electric double layer. The electrons in the first organic film 4 are tunnel-injected into the third organic film 6 by this strong electric field to perform radiative recombination in the third organic film 6.

Figure 6:
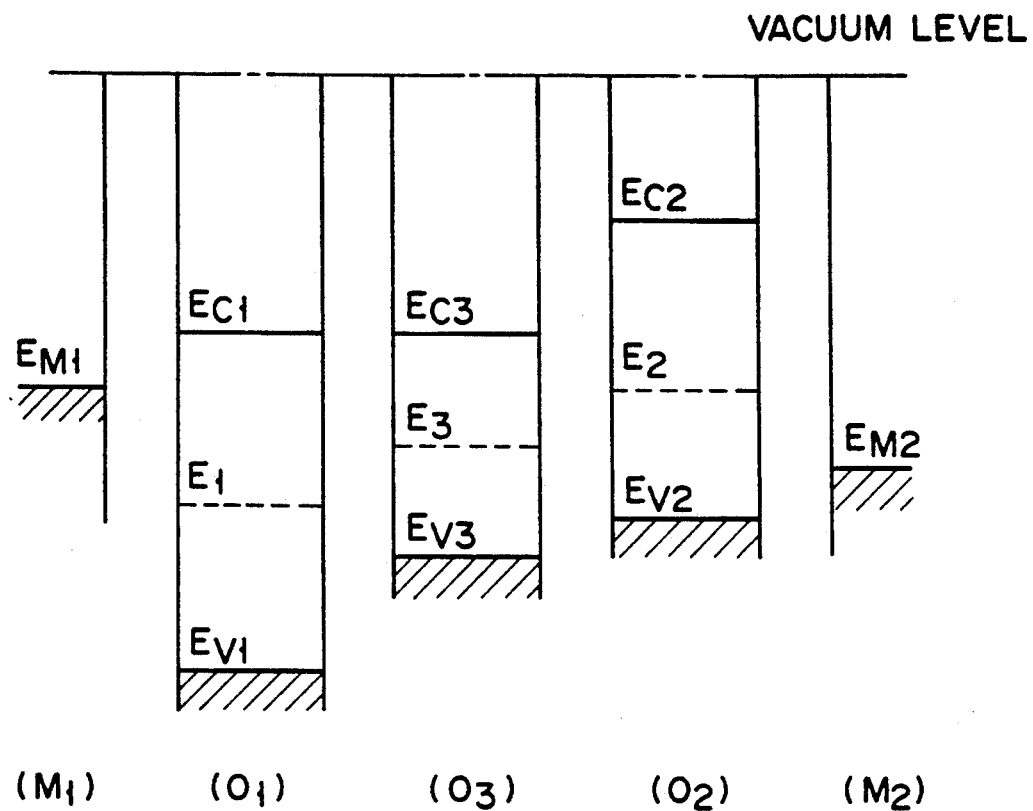
FIG. 6 is an energy band chart showing the electrical characteristics before junction of each layer of an organic EL device according to the third embodiment of the present invention.

FIG. 6 is an energy band chart before junction of layers of another device. In this embodiment, as shown in FIG. 6, the following condition is set between first and third organic films 4 and 6:

$$E_{C1} \sim E_{C3}$$

In addition, the following condition is set between the second and third organic films 5 and 6:

$E_{V2}<E_{V3}$

The other conditions are the same as those of the device shown in FIG. 2.

Figure 7A:
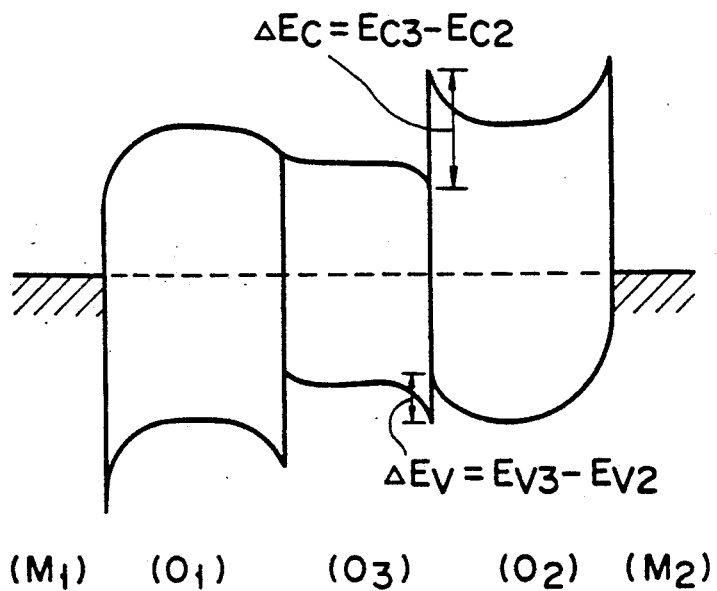
FIG. 7A is an energy band chart showing a thermal equilibrium state of the EL device.
Figure 7B:
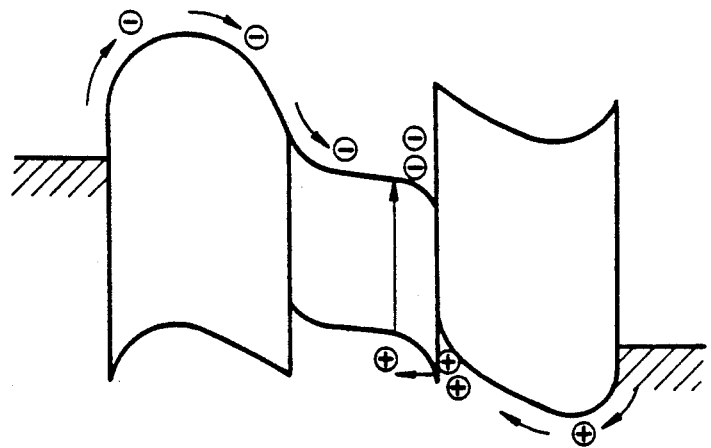
FIG. 7B is an energy band chart showing a biased state of the EL device.

FIGS. 7A and 7B are energy band charts for explaining an operation of an organic EL device of this embodiment. FIG. 7A is an energy band chart in a thermal equilibrium state. As shown in FIG. 7A, in this embodiment, a blocking barrier is formed between the second and third organic films 5 and 6 to block the flow of holes from the second organic film 5 to the third organic film 6. This barrier is defined as:

$$\Delta E_V = E_{V3} - E_{V2}$$

This blocking barrier which blocks the holes is smaller than a blocking barrier which blocks the flow of electrons from the third organic film 6 to the second organic film 5. This barrier for blocking electrons is defined as:

$$\Delta E_C = E_{C3} - E_{C2}$$

A state wherein a forward biasing voltage is applied to the EL device of this embodiment is shown in FIG. 7B. The electrons injected from a first electrode 2 into the first organic film 4 are supplied to the third organic film 6, and are accumulated at the blocking barrier junction between the third and second organic films 6 and 5. The holes injected from a second electrode 3 into the second organic film 5 are accumulated at the blocking barrier junction between the second and third organic films 5 and 6. Thus, the carriers accumulated at the junction between the second and third organic films 5 and 6 form an electric double layer. If the biasing voltage exceeds a predetermined value, holes in the second organic film 5 are tunnel-injected into the third organic film 6 to perform radiative recombination in the third organic film 6.

According to the above embodiments, a large number of carriers are confined in the third organic film. As a result, high-efficiency light emission can be achieved.

An embodiment of a device having an emitting layer with a multi-layered structure consisting of a plurality of organic films will be described hereinafter.

Figure 8:
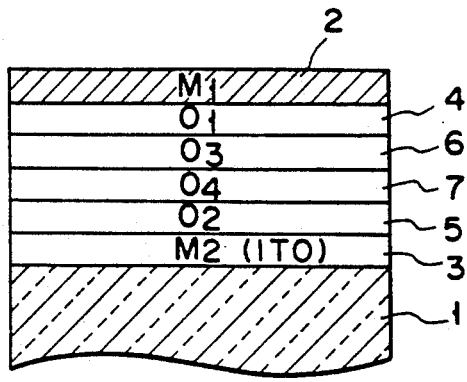
FIG. 8 is a sectional view showing an organic EL device according to the fourth embodiment of the present invention.

FIG. 8 is a sectional view showing the structure of an organic EL device of such an embodiment. As is apparent from a comparison with FIG. 1, in this embodiment, an emitting layer region sandwiched between first and second organic films 4 and 5 is a multi-layered body of third and fourth organic films 6 and 7.

Figure 9:
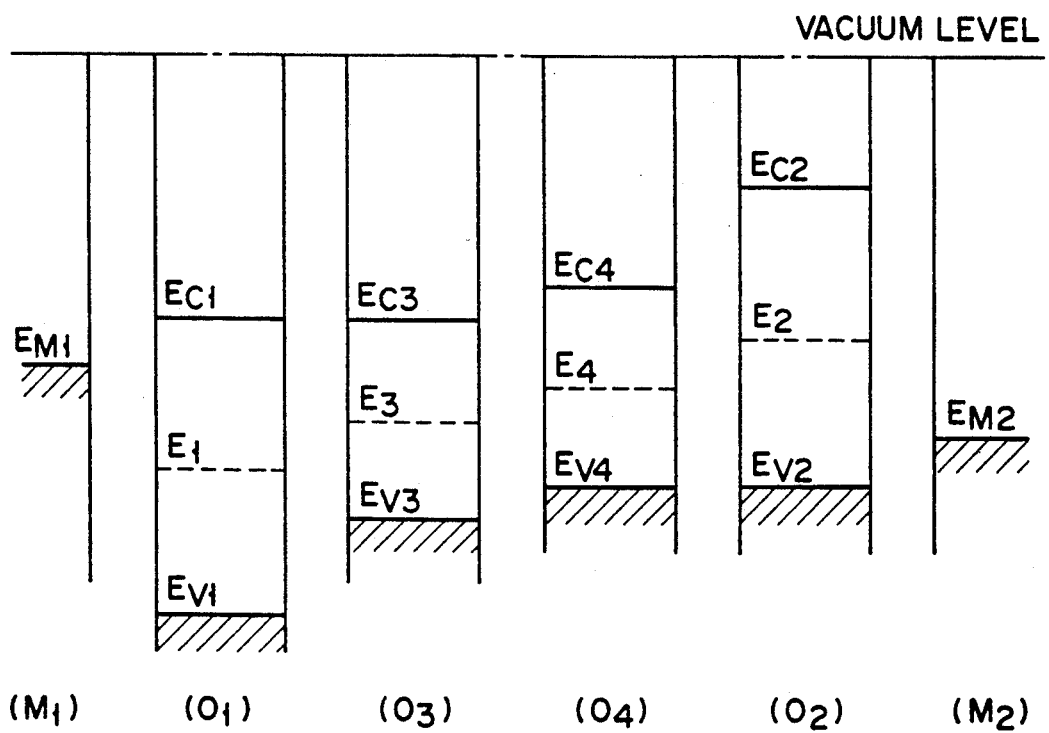
FIG. 9 is an energy band chart showing the electrical characteristics before junction of each layer of the EL device.

FIG. 9 is an energy band chart before junction of layers of the EL device of this embodiment. As shown in FIG. 9, in this embodiment, materials are combined to satisfy the following conditions:

$$E_1 > E_3 > E_4 > E_2$$

$$E_{C3} - E_{V3} < E_{C1} - E_{V1}$$

$$E_{C4} - E_{V4} < E_{C2} - E_{V2}$$

$$E_{C1} \sim E_{C3} > E_{C4}$$

$$E_{V2} \sim E_{V4} \sim E_{V3}$$

FIG. 10A is an energy band chart of the EL device of this embodiment in a thermal equilibrium state. The third and fourth organic films 6 and 7 each having a small band gap are sandwiched between the first and second organic films 4 and 5 each having a large band gap. As for a conduction band the interface between the first and third organic films 4 and 6 is smooth, and a blocking barrier is formed between the third and fourth organic films 6 and 7. This barrier is defined as:

$$\Delta E_C = E_{C4} - E_{C3}$$

This barrier to block electrons is smaller than that between the fourth and second organic films 7 and 5. On the other hand, as for a valence band, the interface between the second and fourth organic films 5 and 7 is smooth, and a blocking barrier is formed between the third and fourth organic films 6 and 7. This barrier is defined as:

$$\Delta E_V = E_{V3} - E_{V4}$$

This blocking barrier which blocks holes is smaller than that between the third and first organic films 6 and 4.

FIG. 10B is an energy band chart obtained when a biasing voltage is applied to the E device of this embodiment to set a second electrode 3 at a positive potential with respect to the first electrode. Electrons are injected from a first electrode 2 into the first organic film 4. The injected electrons are transferred to the third organic film 6, and are accumulated at the blocking barrier junction between the third and fourth organic films 6 and 7. Holes are injected from the second electrode 3 into the second organic film 5. The injected holes are transferred to the fourth organic film 7, and are accumulated at the blocking barrier junction between the third and fourth organic films 6 and 7. Thus, in this embodiment, an electric double layer is formed in the junction between the third and fourth organic films 6 and 7. If the biasing voltage exceeds a predetermined value, electrons are tunnel-injected from the third organic film 6 into the fourth organic film 7 to perform radiative recombination in the fourth organic film 7. At the same time, or at a different threshold voltage, holes are tunnel-injected from the fourth organic film 7 into the third organic film 6 to perform radiative recombination in the third organic film 6.

In this case, if the threshold value of the hole injection from the fourth organic film 7 into the third organic film 6 is equal to that of the electron injection from the third organic film 6 into the fourth organic film 7, light emission in the third organic film 6 is mixed with light emission in the fourth organic film 7. If these threshold values are different from each other, light emission in one organic film has priority over that in the other organic film. For example, light emission in the third organic film 6 occurs at the first threshold value. A biasing voltage is further increased, and light emission in the fourth organic film 7 overlaps the light emission in the third organic film 6 at the second threshold value. This priority order can be reversed depending on the film materials. Regardless of the priority, in this case, one-pixel multi-color display capable of emission color control by a biasing voltage can be realized.

In this embodiment, the third and fourth organic films serving as emitting layers are sandwiched between the first and second organic films each having a large band gap. Therefore, high-efficiency light emission can be achieved by a carrier trapping effect.

An embodiment using two emitting layers will be described below in detail. In a device shown in FIG. 8, the following materials are selected.

First Electrode 2: erbium film
Second Electrode 3: ITO film
First Organic Film 4: tetranitrobifluorenonyl
Second Organic Film 5:

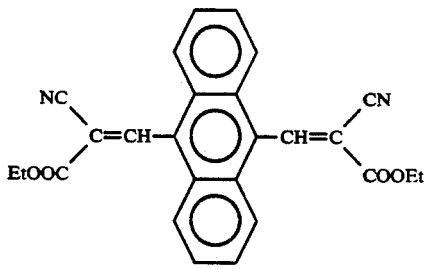

Third Organic Film 6:

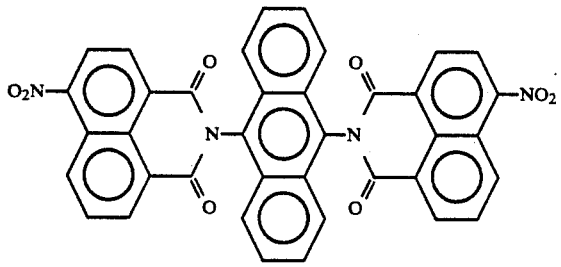

Forth Organic Film 7: bicoronenyl

The process for manufacturing the device is basically the same as that described above. When a biasing voltage was applied to the obtained device, a current of about 10 mA flowed at an application voltage of 5 V, and light emission with a luminance of about 2,000 Cd/m$^2$ was recognized. A emission efficiency was about 20%.

An embodiment wherein the present invention is applied to a multi-color EL device will be described below. The multi-color EL device according to the present invention basically has a multi-layered structure consisting of the first and second organic films in which a blocking barrier junction is formed to block electrons or holes, and the first and second electrodes which sandwich this multi-layered structure. The first electrode for electron injection is formed o the first organic film side, and the second electrode for hole injection is formed on the second organic film side.

In such a basic structure, the first multi-color organic EL device utilizes the following phenomenon. That is, when a positive biasing voltage with respect to the second electrode is applied between the first and second electrodes, electrons injected from the first electrode into the first organic film and holes injected from the second electrode into the second organic film are accumulated at the interface of the blocking barrier unction. Of the accumulated electrons and holes, the electrons are tunnel-injected into the second organic film to perform radiative recombination in the second organic film, and the holes are tunnel-injected into the first organic film to perform radiative recombination in the first organic film.

More specifically, materials are selected to satisfy the above conditional inequalities (1) to (4), in the same manner as in the above mentioned embodiments. In inequalities (1) to (4), $E_{M1}$ and $E_{M2}$ are the work functions of the first and second electrodes, respectively, $E_{C1}$, $E_1$, and $E_{V1}$ are the conduction band level, the Fermi level, and the valence band level of the first organic film, respectively, and $E_{C2}$, $E_2$, and $E_{V2}$ are the conduction band level, the Fermi level, and the valence band level of the second organic film, respectively.

In order to control an emission color by a biasing voltage, materials are selected to satisfy the following condition (5) or (6) in addition to the above conditions (1) to (4):

$$E_{C1}-E_{C1}<E_{V1}-E_{V2} \tag{5}$$

$$E_{C1}-E_{C1}>E_{V1}-E_{V2} \tag{6}$$

The second multi-color organic EL device has a structure obtained by additionally inserting the third organic film between the second organic film and the second electrode in addition to the above-mentioned basic structure. When a positive biasing voltage with respect to the second electrode is applied between the first and second electrodes, electrons injected from the first electrode into the first organic film and holes injected from the second electrode into the second organic film through the third organic film are accumulated at the interface of the blocking barrier junction. Of the accumulated electrons and holes, the electrons are tunnel-injected into the second organic film at the first threshold voltage to perform radiative recombination in the second organic film, and are further injected into the third organic film at the second threshold voltage to perform radiative recombination in the third organic film.

More specifically, in order to achieve such multi-color emission, materials are selected to satisfy the following conditions (7) to (10) in addition to the relationship of the electrical characteristics in the materials of the first multi-color organic EL device:

$$E_{C1}-E_{C2}<E_{V1}-E_{V2} \tag{7}$$

$$E_{C2}E_{C3} \tag{8}$$

$$E_{V2} \sim E_{V3} \tag{9}$$

$$E_{M2}<E_3 \tag{10}$$

where $E_{C3}$, $E_3$, and $E_{V3}$ are the conduction band level, the Fermi level, and the valence band level of the third organic film.

In addition, the third multi-color organic EL device has a structure obtained by additionally inserting the third organic film between the first electrode and the first organic film in the above-mentioned basic structure. When a positive biasing voltage with respect to the second electrode is applied between the first and second electrodes, electrons injected from the first electrode into the first organic film through the third organic film, and holes injected from the second electrode into the second organic film ar accumulated at the interface of the blocking barrier junction. Of the accumulated electrons and holes, the holes are tunnel-injected into the first organic film at the first threshold voltage to perform radiative recombination in the first organic film, and are further injected into the third organic film at the second threshold voltage to perform radiative recombination in the third organic film.

More specifically, in order to achieve such multi-color emission, materials are selected to satisfy the following conditions (11) to (13) in addition to the relationship of the electrical characteristics of the materials in the first multi-color organic EL device:

$$E_{C1} - E_{C2} > E_{V1} - E_{V2} \quad (11)$$

$$E_{C3} \sim E_{C1} \quad (12)$$

$$E_{V3} < E_{V1} \quad (13)$$

$$E_{M1} < E_3 \quad (14)$$

where $E_{C3}$, $E_3$, and $E_{V3}$ are the conduction band level, the Fermi level, and the valence band level of the third organic film.

In the basic structure of the organic-film EL device according to the present invention, blocking barriers to block electrons and holes are formed on the junction interface between the first and second organic films (conditional inequalities (3) and (4)). In addition, when a biasing voltage to set the second electrode at a positive potential is applied, electrons are injected from the first electrode into the first organic film (conditional inequality (1)), and holes are injected from the second electrode into the second organic film (conditional inequality (2)). As a result, an electric double layer is formed on the blocking barrier junction interface between the first and second organic films.

In the first multi-color organic EL device, therefore, when a biasing voltage exceeds a predetermined threshold value, electrons in the first organic film are injected into the second organic film to perform radiative recombination in the second organic film. If the biasing voltage exceeds a predetermined threshold value, holes in the second organic film are tunnel-injected into the first organic film to perform radiative recombination in the first organic film. Thus, light emission with a wavelength determined by the first organic film and light emission with a wavelength determined by the second organic film can be obtained. When the conditional inequality (5) is satisfied, tunnel injection of electrons from the first organic film into the second organic film has priority over that of holes. When a biasing voltage is applied, therefore, light emission caused by radiative recombination in the second organic film is recognized at the first threshold voltage, and light emission is simultaneously recognized in the first and second organic films at the second threshold voltage. When the conditional inequality (6) is satisfied, this relationship is reversed.

According to the second multi-color organic EL device, in the blocking barrier junction between the first and second organic films, a blocking barrier which blocks electrons is set to be lower than that which blocks holes (conditional inequalities (7) and (8)). In addition, materials are selected so that holes injected from the second electrode into the third organic film are supplied to the second organic film with little interference (conditional inequalities (9) and (10)). Therefore, of carriers accumulated at the blocking barrier junction between the first and second organic films to form an electric double layer upon application of a biasing voltage, electrons are tunnel-injected into the second organic film to perform radiative recombination in the second organic film. If the thickness of the second organic film is smaller than the mean free path of the carriers, a large number of electrons are supplied to the third organic film upon a further increase in biasing voltage, thus performing radiative recombination in the third organic film. Therefore, the multi-color EL device capable of emission color control by a biasing voltage can be obtained.

According to the third multi-color organic EL device, in the blocking barrier junction between the first and second organic films, a blocking barrier which blocks holes is set to be lower than that which blocks electrons (conditional inequalities (11) and (12)). In addition, materials are selected so that electrons injected from the first electrode into the third organic film are supplied to the second organic film with little interference. Therefore, of the carriers accumulated at the blocking barrier junction between the first and second organic films to form an electric double layer upon application of a biasing voltage, holes are tunnel-injected into the first organic film to perform radiative recombination in the first organic film. When the biasing voltage is further increased, a large number of holes are supplied to the third organic film to perform radiative recombination in the third organic film. Therefore, the multi-color EL device capable of emission color control by a biasing voltage can be obtained.

Embodiments of these multi-color organic EL devices will be described hereinafter with reference to the accompanying drawings.

Figure 11:
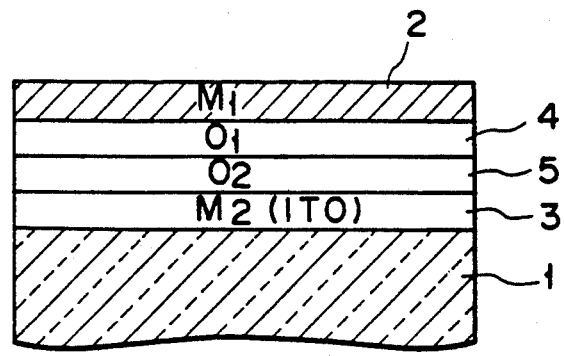
FIG. 11 is a sectional view showing a multi-color organic EL device according to the fifth embodiment of the present invention.

FIG. 11 shows a sectional device structure of the first multi-color organic EL device of the embodiment. This device includes a first electrode ($M_1$) 2, a first organic film ($O_1$) 4, a second organic film ($O_2$) 5, and a second electrode ($M_2$) 3, in the order named from the upper side. The second electrode 3 is a transparent electrode of, e.g., ITO formed on a glass substrate 1 in this embodiment. Light is extracted from the glass substrate 1 side. In the process for manufacturing this device, the films are sequentially stacked on the substrate by, e.g., vacuum evaporation or vacuum sublimation, in the same manner as in the above embodiments.

Figure 12:
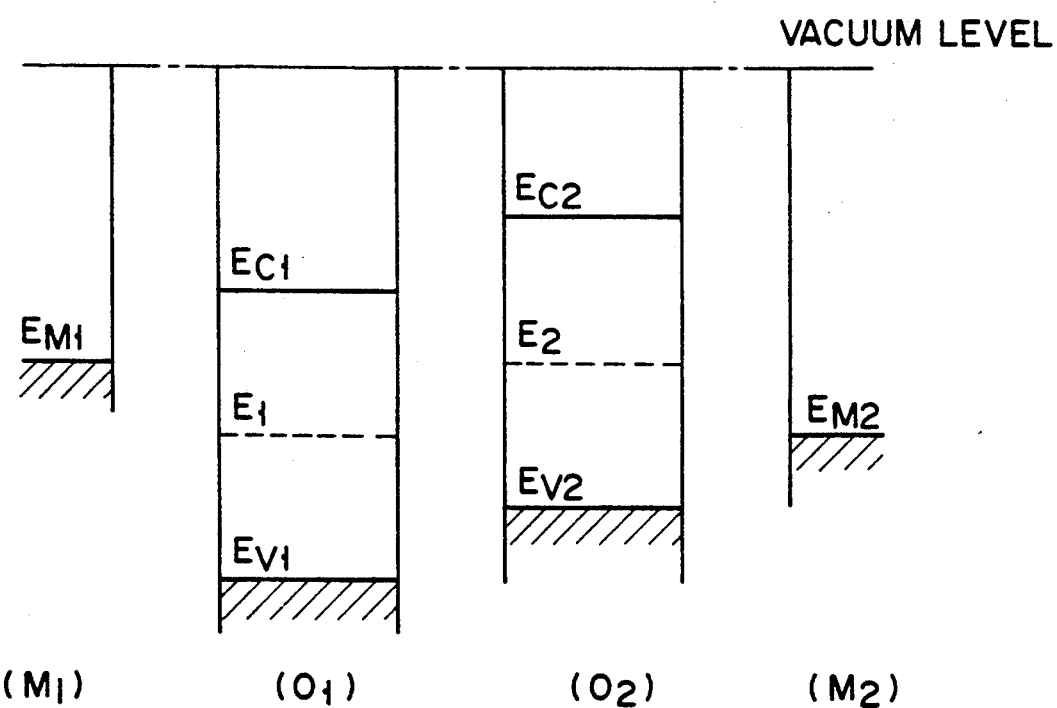
FIG. 12 is an energy band chart showing the electrical characteristics before junction of each layer of the EL device.

FIG. 12 is an energy band chart in a state wherein the layers which constitute the multi-color EL device are isolated from each other. As shown in FIG. 12, materials are selected to satisfy the following inequalities:

$$E_{C1} > E_{C2}$$

$$E_{V1} > E_{V2}$$

where $E_{C1}$, $E_1$, and $E_{V1}$ are the conduction band level, the Fermi level, and the valence band level of the first organic film 4, and $E_{C2}$, $E_2$, and $E_{V2}$ are the conduction band level, the Fermi level, and the valence band level of the second organic film 5. In addition, the first electrode 2 has a work function $E_{M1}$ which satisfies the following inequality:

$$E_{M1} < E_1$$

Electrons are easily injected from the first electrode 2 into the first organic film 4. The second electrode 3 has a work function $E_{M2}$ which satisfies the following inequality:

$$E_{M2} > E_2$$

Holes are easily injected from the second electrode 2 into the second organic film 5.

Figure 13:
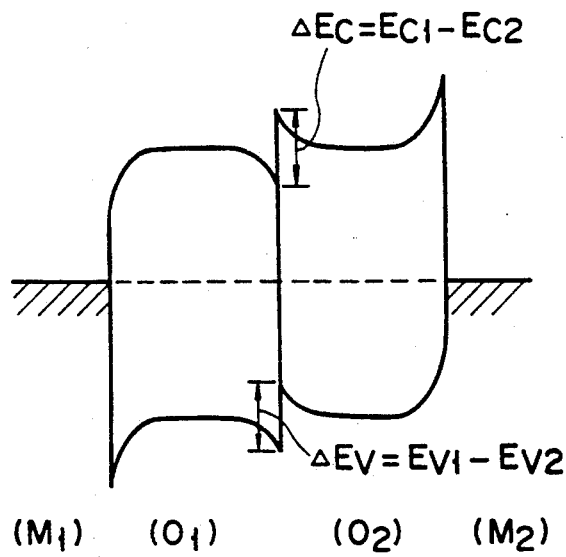
FIG. 13 is an energy band chart showing a thermal equilibrium state of the EL device.

FIG. 13 is an energy band chart of the EL device in which the layers are stacked in a thermal equilibrium state. In the thermal equilibrium state, the Fermi levels of the components coincide with each other. In accordance with the difference between the work functions of the electrodes and the energy levels of the organic films shown in FIG. 12, therefore, a junction is formed between the first electrode 2 and the first organic film 4 such that electrons are easily injected from the first electrode 2, as shown in FIG. 13. A junction is formed between the second electrode 3 and the second organic film 5 such that hoes are easily injected from the second electrode 3. Between the first and second organic films 4 and 5, a blocking barrier is formed in the conduction band. This barrier is defined as:

$$\Delta E_C = E_{C1} - E_{C2}$$

A blocking barrier is also formed in the valence band. This barrier is defined as:

$$\Delta E_V = E_{V1} - E_{V2}$$

Figures 14A, 14B:
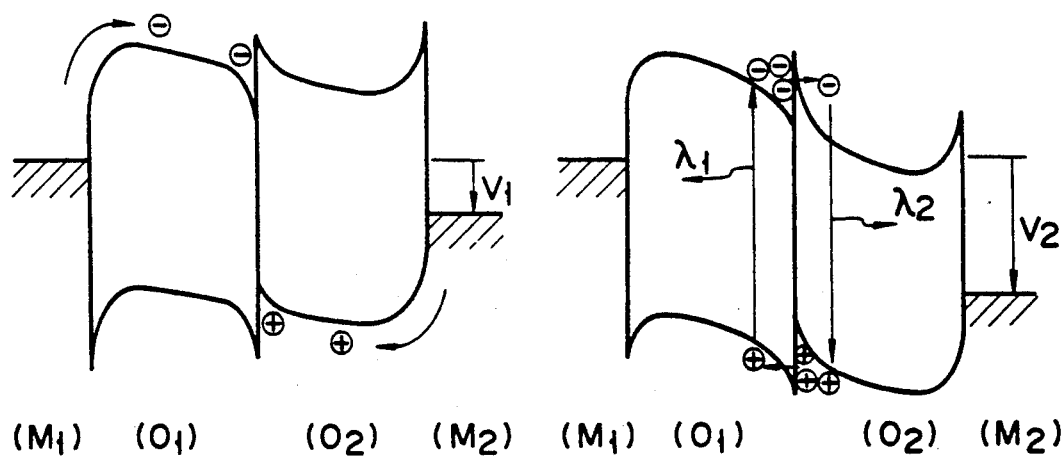
FIGS. 14A and 14B are energy band charts for explaining a basic operation of multi-color light emission of the EL device.

An operation principle of the multi-color organic EL device of this embodiment will be described hereinafter with reference to FIGS. 14A and 14B. FIG. 14A is an energy band chart of the device obtained when a given positive biasing voltage $V_1$ with respect to a voltage applied to the first electrode 2 is applied to the second electrode 3. Electrons are injected from the first electrode 2 into the first organic film 4, and holes are injected from the second electrode 3 into the second organic film 5. These injected electrons and holes are accumulated at the blocking barrier junction interface between the first and second organic films 4 and 5 to form an electric double layer. As shown in FIG. 14$b$, when the biasing voltage exceeds a predetermined threshold value and reaches $V_2$, the carriers which form the electric double layer are tunnel-injected in an adjacent layer through the blocking barrier junction. The holes injected from the second organic film 5 into the first organic film 4 are recombined with the electrons which are major carriers in the first organic film 4, thereby obtaining light emission with a first wavelength of $\lambda 1$. The electrons injected from the first organic film 4 into the second organic film 5 ar recombined with the holes which are major carriers in the second organic film 5, thereby obtaining light emission with a second wavelength of $\lambda 2$.

Whether light emission with the first or second wavelength is predominant is determined in accordance with the relationship between the heights $\Delta E_C$ and $\Delta E_V$ of blocking barriers which respectively block electrons and holes between the first and second organic films 4 and 5. In accordance with selection of materials, therefore, the following EL devices can be obtained:

(1) An EL device for simultaneously obtaining light with the first and second wavelengths at a predetermined threshold voltage;

(2) A multi-color EL device for obtaining light emission with only the first wavelength at the first threshold voltage, and obtaining multi-color light emission at the second threshold voltage; and (3) A multi-color EL device for obtaining light emission with only the first wavelength at the first threshold voltage, and obtaining multi-color light emission at the second threshold voltage.

Figure 15A:
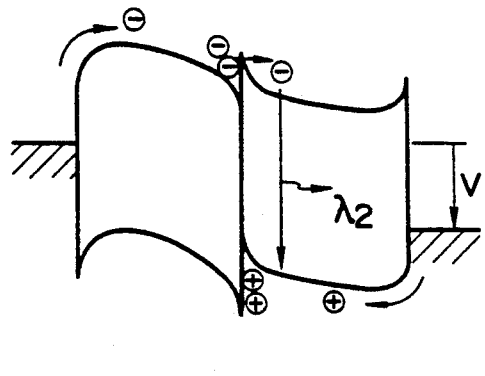
FIGS. 15A and 15B are energy band charts for explaining an operation in the first multi-color light emission mode in the EL device shown in FIG. 11.
Figure 15B:
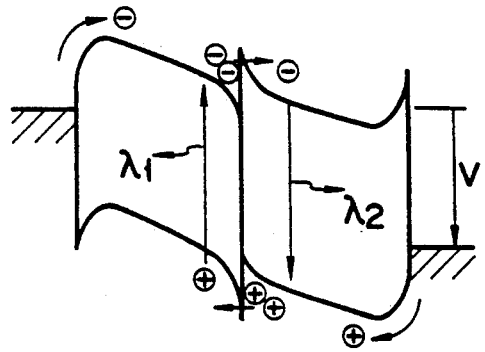

FIGS. 15A and 15B are energy band charts for explaining an operation of the multi-color EL device in which materials are selected to satisfy the following inequality:

$$E_{C1} - E_{C2} < E_{V1} - E_{V2}$$

As is apparent from the above-mentioned principle, electrons and holes are respectively injected into the first and second organic films 4 and 5 by the biasing voltage V to form the electric double layer. When the biasing voltage V exceeds a first threshold voltage Vth1, electrons are tunnel-injected from the first organic film 4 into the second organic film 5 to perform radiative recombination in the second organic film, thus emitting light with the wavelength of $\lambda 2$, as shown in FIG. 14A. When the biasing voltage V is further increased to exceed a second threshold value Vth2, tunnel injection of holes from the second organic film 5 into the first organic film 4 is started to perform radiative recombination in the first organic film, and light emission with the wavelength of $\lambda 1$ overlaps the above light emission, as shown in FIG. 15B.

Figure 16A:
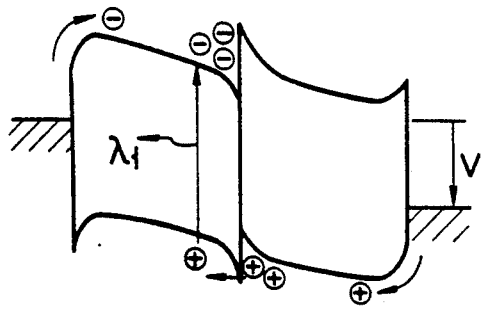
FIGS. 16A and 16B are energy band charts for explaining an operation in the second multi-color light emission mode in the EL device shown in FIG. 11.
Figure 16B:
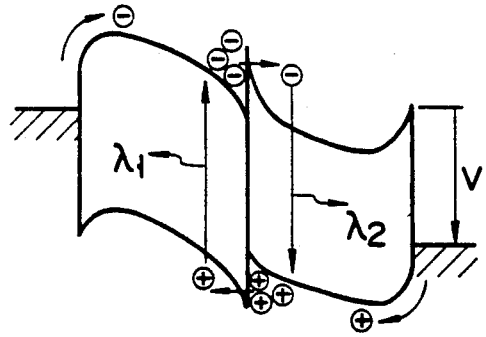

FIGS. 16A and 16B are energy band charts for explaining an operation of the multi-color EL device in which materials are selected to satisfy the following inequality:

$$E_{C1} - E_{C2} > E_{V1} - E_{V2}$$

In this case, in contrast to FIGS. 15A and 15B, light emission in the first organic film 4 (wavelength $\lambda 1$) occurs at the first threshold voltage Vth1, and light emission (wavelength $\lambda 2$) in the second organic film 5 overlaps the above light emission at the second threshold voltage Vth2. Note that, the first and second threshold voltages Vth1 and Vth2, and the wavelengths $\lambda 1$ and $\lambda 2$ in FIGS. 16A and 16B are normally not equal to those in FIGS. 15A and 15B.

A detailed embodiment of the multi-color organic EL device will be described hereinafter. In the device shown in FIG. 11, the following materials are selected.
First Electrode 2: erbium film
Second Electrode 3: ITO film
First Organic Film 4:

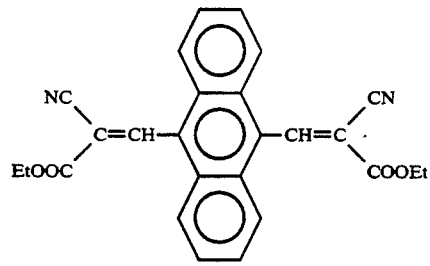

Second Organic Film 5: bipyrenyl

It is confirmed that these material components satisfy the conditions shown in FIG. 12 and the condition of $E_{C1} - E_{C2} < E_{V1} - E_{V2}$ by the above-mentioned displacement current measurement method. The process for manufacturing the device is as follows. First, the second organic film having a thickness of 1,000 Å is formed on a glass substrate on which an ITO film is formed by vacuum sublimation (vacuum degree ~ $10^{-6}$ Torr). Similarly, the first organic film is formed on the second organic film to have a thickness of 1,000 Å by vacuum sublimation. Finally, the erbium film having a thickness of 1,000 Å is formed by vacuum evaporation.

When a biasing voltage was applied to the obtained EL device to set an ITO electrode at a positive potential, a current of 5 mA flowed at 3 V, and orange light emission with a luminance of 500 Cd/m² was recognized. This was light emission in the first organic film. When the biasing voltage was increased up to 15 V, the emission color was changed to yellowish green. This was caused by mixing of blue light emitted by the second organic film.

An embodiment of another multi-color EL device with a two-layered structure of organic films will be described below. In the device shown in FIG. 11, the following materials are selected.

First Electrode 2: erbium film
Second Electrode 3: ITO film
First organic Film 4:

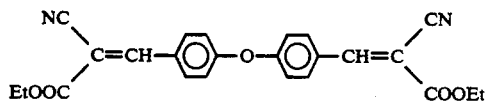

Second Organic Film 5:

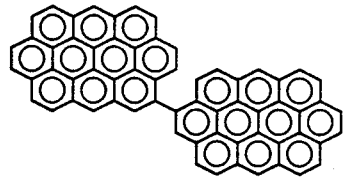

The process for manufacturing the device and the thickness of each layer are the same as those in the above multi-color EL device.

When a biasing voltage was applied to the obtained EL device to set the ITO electrode at a positive potential, yellow light emission was recognized at 5 V. This was caused by light emission in the first organic film 4. When the biasing voltage was further increased up to 15 V, the emission color was changed into reddish orange. This was caused by overlapping of the light emitted in the second organic film 5.

The multi-color EL device using a two-layered organic film structure has been described above. In addition, three organic films can be combined to form a multi-color EL device on the basis of the two-layered structure. Such embodiments will be described below.

Figure 17:
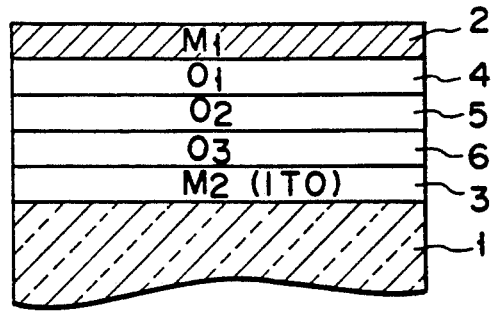
FIG. 17 is a sectional view showing a multi-color organic EL device according to the sixth embodiment of the present invention.

FIG. 17 is a sectional view of a multi-color organic EL device of such an embodiment. Unlike in FIG. 11, a third organic film 6 is sandwiched between a second organic film 5 and a second electrode 3 in this embodiment.

Figure 18:
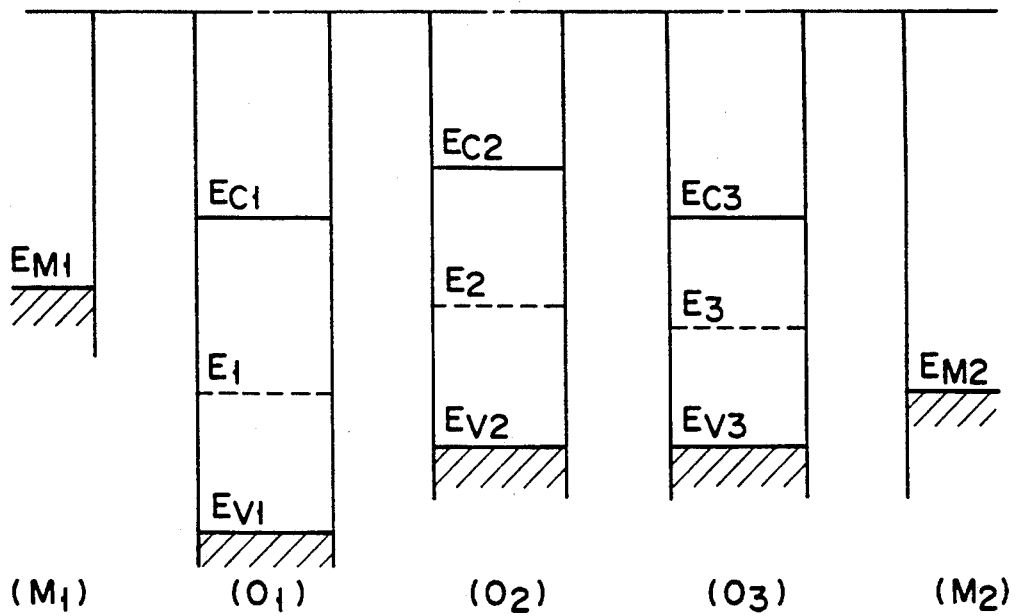
FIG. 18 is an energy band chart showing the electrical characteristics before junction of each layer of the EL device.

FIG. 18 shows the electrical characteristics, e.g., a work function of each layer in the EL device shown in FIG. 17. A relationship of the material characteristics between a first electrode 2, a first organic film 4, the second organic film 5, and the second electrode 3 is basically the same as that of the multi-color EL device shown in FIG. 11. However, the energy levels of the first and second organic films 4 and 5 are set to have the following relationship:

$$E_{C1} - E_{C2} < E_{V1} - E_{V2}$$

In the third organic film 6, on the basis of the relationship between the second organic film 5 and the second electrode 3, the following conditions are set:

$$E_{C3} > E_{C2}$$

$$E_{V3} - E_{V2}$$

$$E_3 < E_{M2}$$

where $E_{C3}$ is the conduction band level, $E_3$ is the Fermi level, and $E_{V3}$ is the valence band level.

Figure 19:
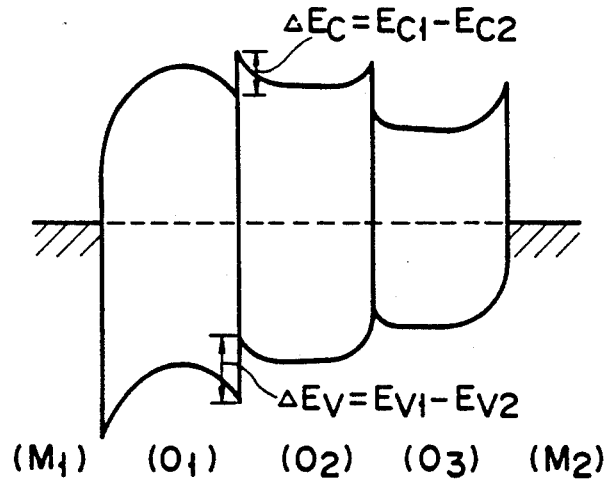
FIG. 19 is an energy band chart showing the EL device in a thermal equilibrium state.

An energy band chart of the EL device in which these layers are stacked in a thermal equilibrium state is, therefore, shown in FIG. 19. Blocking barriers are formed between the first and second organic films 4 and 5 to block electrons and holes, respectively, as in the above embodiments. However, a blocking barrier $\Delta E_C$ which blocks electrons on the conduction band side is formed to be smaller than a blocking barrier $\Delta E_V$ which blocks holes on the valence band side. The thickness of the second organic film 5 is smaller than the mean free path of the carriers, and a blocking barrier which blocks the flow of electrons from the second organic film 5 to the third organic film 6 is not formed. Holes are easily injected from the second electrode 3 into the third organic film 6 and the holes injected into the third organic film 6 are supplied to the second organic film with little interference.

Figure 20A:
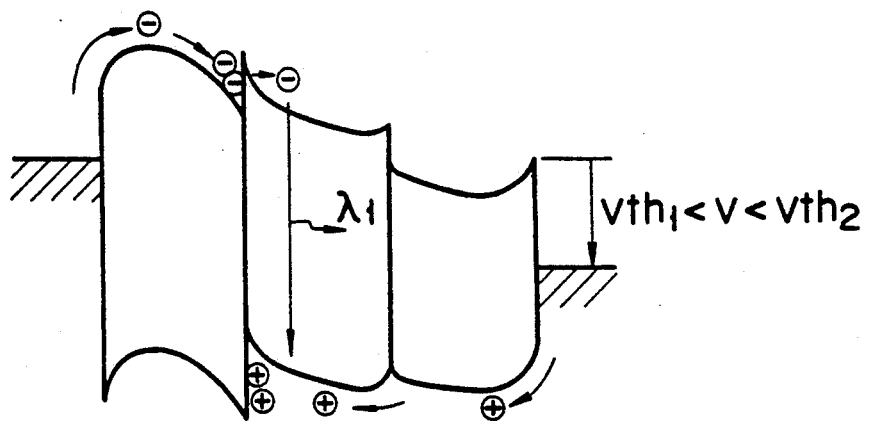
FIGS. 20A and 20B are energy band charts for explaining a light-emitting operation of the EL device.
Figure 20B:
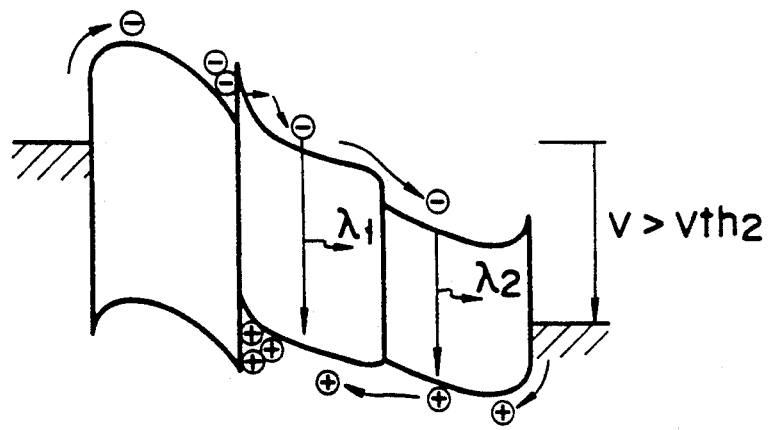

An operation of multi-color light emission in this EL device will be described below with reference to FIGS. 20A and 20B. When a forward biasing voltage is applied to the device in the same manner as in the above embodiments, electrons are injected from the first electrode 2 into the first organic film 4, and holes are injected from the second electrode 3 into the second organic film 5 through the third organic film 6. The injected carriers are accumulated at the blocking barrier junction between the first and second organic films 4 and 5 to form an electric double layer. When the biasing voltage exceeds a first threshold value Vth1, electrons are tunnel-injected from the first organic film 4 into the second organic film 5 to recombine with the holes in the second organic film 5, thus emitting light, as shown in FIG. 20A. When the biasing voltage is further increased to exceed a threshold value Vth2, a large number of electrons injected from the first organic film 4 into the second organic film 5 are further injected into the third organic film 6 without being recombined, as shown in FIG. 20B. The injected electrons are recombined with the holes in the third organic film 6 to emit light. More specifically, light with a short wavelength is emitted from the second organic film 5 with a large band gap under the low-bias condition. Under the high-bias condition, light with a long wavelength emitted from the third organic film 6 with a small band gap is mixed with the light from the film 5. For example, when the second organic film 5 serves as a blue emitting agent, and the third organic film 6 serves as a yellow emitting agent, blue light is emitted at a low biasing voltage, and white light is emitted at a high biasing voltage.

Figure 21:
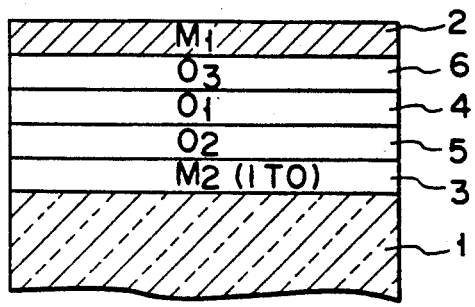
FIG. 21 is a sectional view showing a multi-color organic EL device according to the seventh embodiment of the present invention.

FIG. 21 is a multi-color EL device according to another embodiment using a three-layered structure of organic films. In this embodiment, a third organic film 6 is formed between a first electrode 2 and a first organic film 4.

Figure 22:
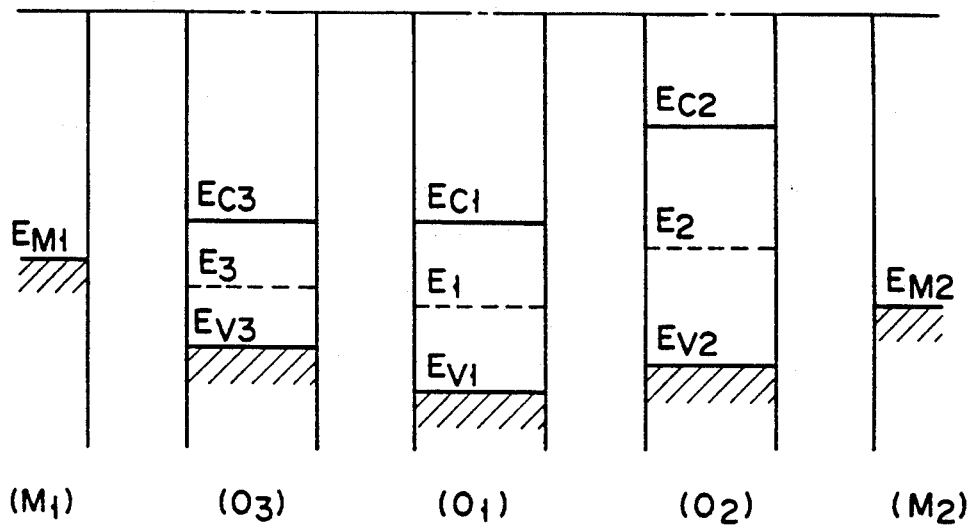
FIG. 22 is an energy band chart showing the electrical characteristics before junction of each layer of the EL device.

FIG. 22 shows energy levels before junction of layers of the EL device of this embodiment. The energy levels of the first and second organic films 4 and 5 are set to have the following relationship opposite to that in FIG. 17:

$$E_{C1}-E_{C2}>E_{V1}-E_{V2}$$

The levels of the third organic film 6 are set as follows on the basis of the relationship between the first organic film 4 and the first electrode 2:

$$E_{C3} \sim E_{C1}$$

$$E_{V3} < E_{V2}$$

$$E_3 > E_{M1}$$

where $E_{C3}$ is the conduction band level, $E_3$ is the Fermi level, and $E_{V3}$ is the valence band level.

Figure 23:
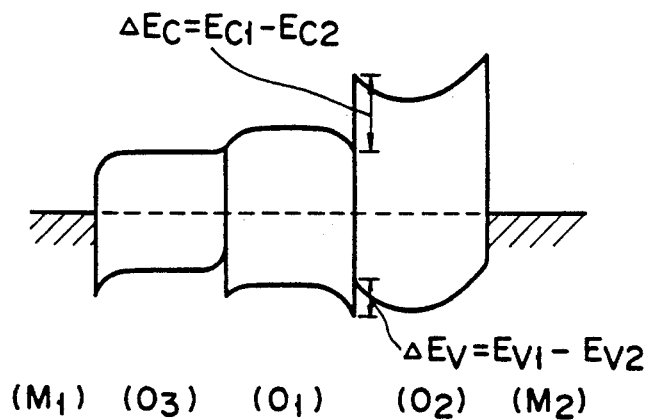
FIG. 23 is an energy band chart showing the EL device in a thermal equilibrium state.

FIG. 23 is, therefore, an energy band chart of the EL device in which these layers are connected to each other in a thermal equilibrium state. Blocking barriers are formed between the first and second organic films 4 and 5 to block electrons and holes, respectively, as in the above embodiments. However, a blocking barrier $\Delta E_C$ which blocks electrons on the conduction band is formed to be higher than a blocking barrier $\Delta E_V$ which blocks holes on the valence band. The thickness of the second organic film 5 is smaller than the mean free path of the carriers, and a blocking barrier which blocks the flow of holes from the second organic film 5 to the third organic film 6 is not formed. Electrons are easily injected from the first electrode 2 into the third organic film 6, and the electrons injected into the third organic film 6 are supplied to the second organic film 5 without interference.

FIGS. 24A and 24B are energy band charts showing an operation of multi-color light emission in the multi-color E device of this embodiment. Upon application of a biasing voltage, an electric double layer is formed in the blocking barrier junction between the first and second organic films 4 and 5, as in the above embodiments. When the biasing voltage exceeds a first threshold value Vth1, holes in the second organic film 5 are tunnel-injected into the first organic film 4 to perform radiative recombination in the first organic film 4, as shown in FIG. 24A. When the biasing voltage is further increased to exceed a threshold value Vth2, a large number of holes are injected into the third organic film 6 to perform radiative recombination in the third organic film 6, as shown in FIG. 24B. In this embodiment, therefore, multi-color light emission to cause a biasing voltage to control an emission color can be achieved.

Detailed embodiments of the multi-color EL devices respectively shown in FIGS. 17 and 21 will be described hereinafter.

The device shown in FIG. 17 consisted of the following materials.
First Electrode 2: erbium film
Second Electrode 3: ITO film
First Organic Film 4:
bis(dicyano-9-fluorenonyl)ethane

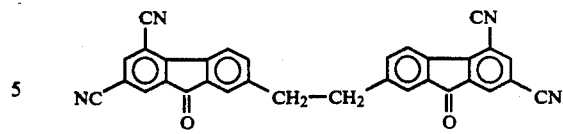

Second Organic Film 5: bipyrenyl
Third Organic Film 6: bicoronenyl

It is confirmed by a displacement current measurement method that these material components satisfy the conditions shown in FIG. 18. The process for manufacturing the device is the same as in the above embodiments.

When a forward biasing voltage was applied to the obtained EL device, a current of about 5 mA flowed at 5 V, and blue light emission with a luminance of 1,000 Cd/m² was obtained. This emission was caused by the second organic film 5. When the biasing voltage was increased up to 15 V, a current of about 20 mA flowed, and whitish light emission with a luminance of 2,000 Cd/m² could be obtained. This emission was caused by mixing of orange light emitted from the third organic film 6 with blue light emitted from the second organic film 5.

The device shown in FIG. 21 consisted of the following materials.
First Electrode 2: erbium film
Second Electrode 3: ITO film
First Organic Film 4:

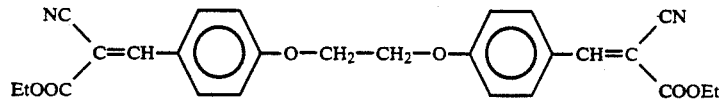

Second Organic Film 5:

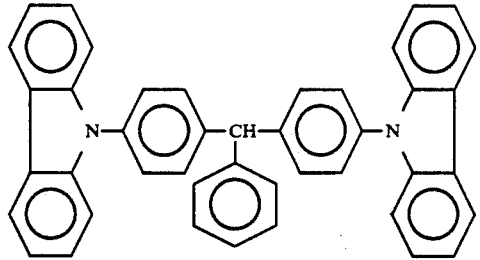

Third Organic Film 6:

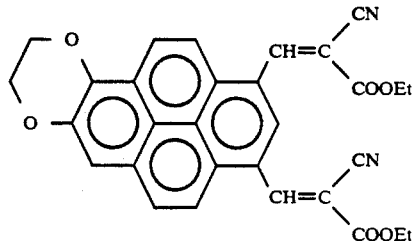

The process for manufacturing the device is the same as in the above embodiments.

When a biasing voltage was applied to the obtained EL device, a current of about 5 mA flowed at 5 V, and light emission with a luminance of 1,000 Cd/m² could be obtained. This emission wa caused by the second organic film 5. When the biasing voltage was increased up to 15 V, a current of about 20 mA flowed, and reddish orange light emission with a luminance of 2,000 Cd/m² could be obtained. This emission was obtained by mixing of red light emitted from the third organic film 6 with yellow light emitted from the second organic film 5.

In the above embodiments, a case wherein both two layers in a multi-layered structure consisting of two organic films serve as emitting layers, and a case wherein two layers in a multi-layered structure consisting of three organic films serve as emitting layers have been described. However, the principle of the above embodiments can be widely applied to a multi-color EL device having a larger number of emitting layers.

In a flat panel display which has been recently used for various electronic equipments, a large number of display pixels are arranged in a matrix form, and are time-divisionally driven. A method for driving the pixels is classified into simple and active matrix methods. Regardless of the method used, a drive voltage pulse is applied to one pixel, and a voltage application time is extremely short. For this reason, in order to obtain a high-quality image, each pixel must have a memory function to some extent. For example, in a liquid crystal display, the capacitance of the liquid crystal itself, or a capacitor arranged in parallel with the liquid crystal has the memory function.

When the organic E device is applied to such a matrix-driven flat panel display, the device must have a memory function. So far, however, such a memory function of the organic EL device has not been reported.

In the organic EL device according to the present invention, since an effect of simultaneous injection and accumulation of electrons and holes in the organic film is utilized, the light-emission characteristics of the device can have a memory function. When electron-injection electrodes are formed on the upper and lower surfaces of the light-emitting organic film, only electrons are injected into the organic film upon application of a biasing voltage. The carrier mobility of the organic material used for the EL device is as small as $10^{-3}$ cm²/V·sec. Although electrons injected into such an organic material form a space charge, a current which flows at this time serves as an ohmic current (which is in proportion to a voltage) in a weak electric field. In a strong electric field, this current serves as a space-charge limited current (which is in proportion to the square of a voltage) limited by the internal electric field. When one kind of carriers are injected into the organic film, therefore, the light-emission characteristics hardly provide a memory function.

In order to solve the above problem, according to the present invention, of the upper and lower electrodes which sandwich the stacked organic films, one electrode is of an electron injection type, and the other electrode is of a hole injection type. Therefore, electrons and holes are simultaneously injected and accumulated in the organic films upon application of a biasing voltage. An electric-charge state of each organic film is neutralized when carrier recombination occurs, thereby increasing the carrier mobility. More specifically, so-called conductivity modulation occurs in the organic films, and a resistance is decreased to supply a large current. As a result, when the device is driven by a constant voltage, hysteresis characteristics appear in the electrical characteristics of the organic EL device according to the present invention. When the device is driven by a constant current, negative resistance characteristics appear. As a result, a memory function is generated in the light-emission characteristics. In addition, this memory function appears as an afterimage phenomenon.

FIG. 25 shows voltage-current characteristics obtained when the EL device of the embodiment shown in FIG. 11 is driven by a constant voltage. As a result of a memory function obtained by carrier accumulation, hysteresis characteristics appear, as shown in FIG. 25. Similarly, FIG. 26 shows voltage-current characteristics obtained when the device of this embodiment is driven by a constant current. As a result of a memory function, negative resistance characteristics appear, as shown in FIG. 26. A current represented on the axis of ordinate in each of FIGS. 25 and 26 corresponds to light-emission luminance.

It can be confirmed by the following experiment that the EL device of the embodiment shown in FIG. 11 has the above-mentioned memory function.

Figure 27:
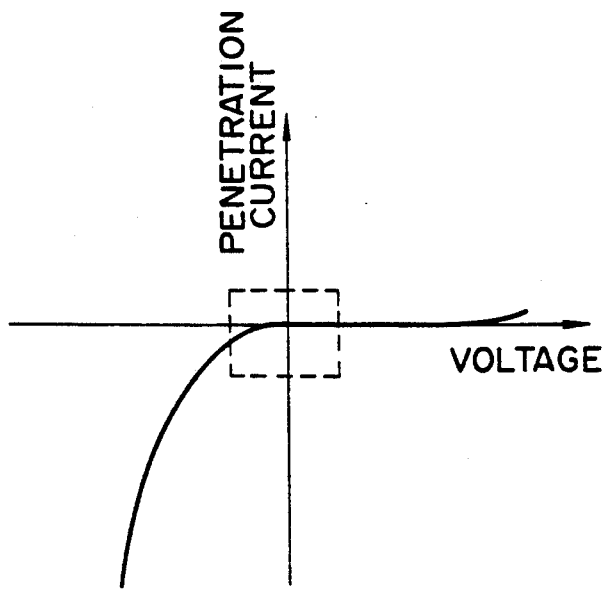
FIG. 27 is a graph showing the voltage-current characteristics of the EL device according to the present invention.

First, when the DC electrical characteristics of the device are measured, rectification characteristics shown in FIG. 27 can be obtained. A current direction with which the first electrode 2 side is set to have a negative polarity is the forward direction. As described above, a forward current flows by tunnel injection achieved by forming an electric double layer. A current does not flow upon application of a reverse voltage because carriers are not injected from the upper and lower electrodes.

Figure 28:
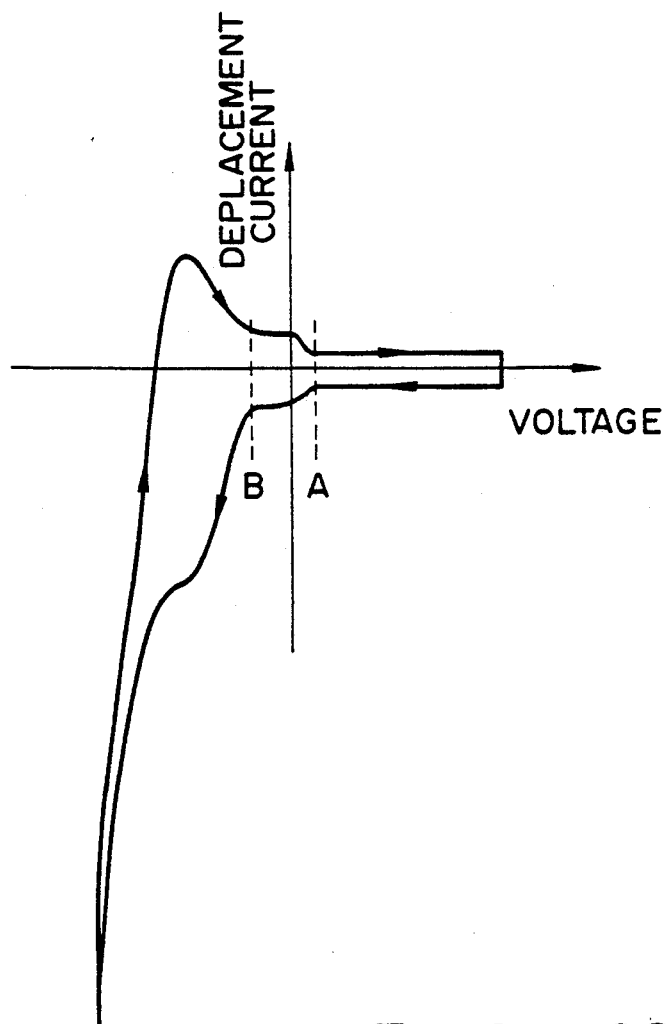
FIG. 28 is a graph showing the displacement current characteristics of the EL device according to the present invention.

Then, a triangular-wave AC biasing voltage shown in FIG. 32 is applied to the EL device, and a displacement current is measured. A measurement region corresponds to a very small current region near the origin of the voltage-current characteristics. This region is surrounded by a broken line in FIG. 27. FIG. 28 shows the obtained potential current characteristics. In a reverse bias region, i.e., on the right side with respect to a point A in FIG. 28, carriers are not injected into the organic films, as described above, and hence electric charges are accumulated between the upper and lower electrodes. At this time, the interelectrode layers serve as a capacitor which sandwiches two organic films serving as insulating members. Therefore, the capacitance is small. As a result, the displacement current is also small.

When a biasing voltage approaches a zero bias from the reverse bias region, carrier injection from the electrodes into the organic films is started. In general, injection of electrons from the first electrode 2 into the first organic film 4 does not occur at the same time as injection of holes from the second electrode 3 into the second organic film 5. If the injection of electrons occurs prior to the injection of holes, injection of electrons from the first electrode 2 into the first organic film 4 starts at the point A in FIG. 28. The injected electrons are accumulated at the blocking barrier junction interface between the first and second organic films 4 and 5. At this time, the capacitance is determined by the second organic film 5, i.e., substantially twice that obtained when carriers are not injected. The displacement current is, therefore, also substantially doubled. When a biasing voltage is further increased along a forward direction, and injection of holes from the second electrode 3 into the second organic film 5 is started, an electric double layer is formed on the interface between the two organic films, as described above. As a result, the capacitance of the device serves as the capacitance of the double layer, and is extremely increased. As shown in FIG. 28, therefore, a displacement current is largely increased at a point B at which the injection of holes is started. When the biasing voltage is further increased, a large forward current flows by tunnel injection into the blocking barrier junction, thus causing light emission.

Thus, when the displacement current characteristics are measured, a state of injection and accumulation of carriers in the EL device according to the present invention can be examined.

Further detailed experimental data will be described below. The EL device shown in FIG. 11 consisted of the following materials.

First Electrode 2: ytterbium film
Second Electrode 3: ITO film
First Organic Film 4: bi(9-malononitrilefluorenyl)
Second Organic Film 5: bipyrenyl (emitting layer)

The process for manufacturing the device is the same as in the above embodiments.

Figure 29:
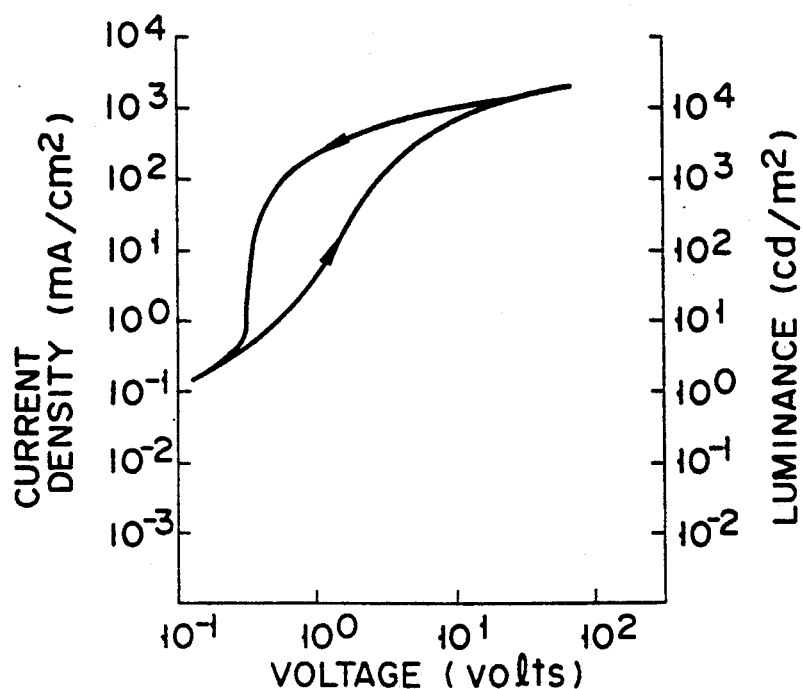
FIG. 29 is a graph showing the hysteresis characteristics of the organic EL device according to the embodiments of the present invention.
Figure 30A:
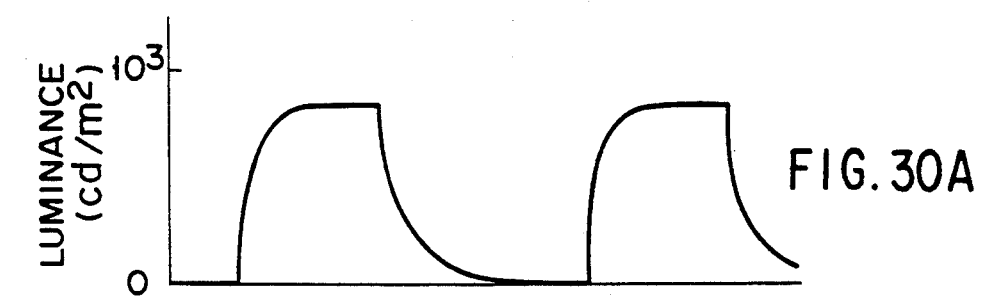
FIG. 30 is a graph showing the afterimage characteristics of the organic E device according to the embodiments of the present invention.
Figure 30B:
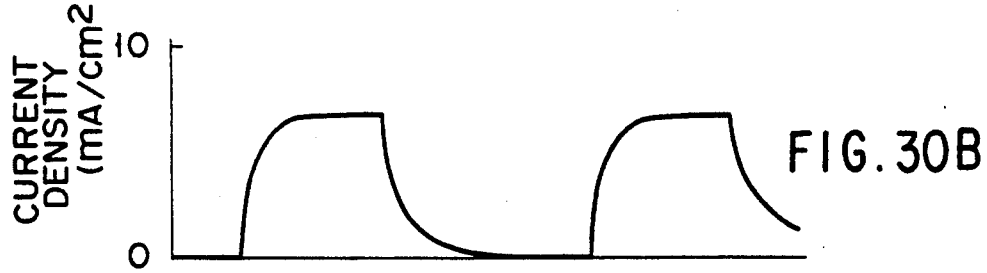
Figure 30C:
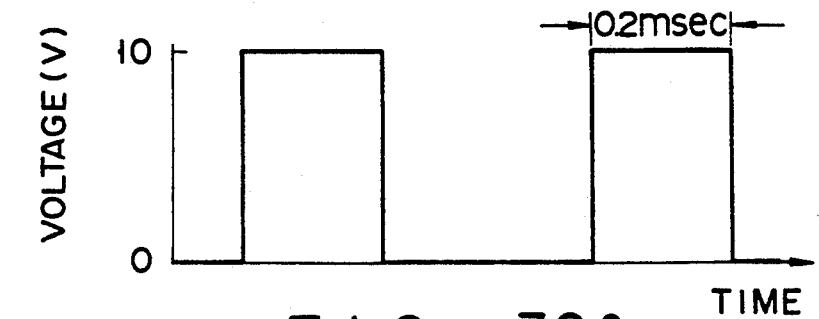

It was confirmed that the displacement current characteristics of the obtained EL device shown in FIG. 28 was obtained. In addition, when a forward biasing voltage to set the ITO electrode side at a positive potential was applied to the EL device, hysteresis characteristics shown in FIG. 29 could be obtained. In addition, as a result of repetitive application of a voltage pulse to set the ITO electrode side at a positive potential, an after-image effect could be recognized in an emission intensity, as shown in FIG. 30.

Similarly, a memory function was recognized in the structure of the EL devices shown in FIGS. 1, 8, 17, and 21.

In the organic EL device according to the present invention, in order to improve the light-emission luminance and to control a light-emission wavelength, two types of organic dyes can be effectively mixed with an organic film serving as an emitting layer. For example, a light-emitting layer is constituted by an organic film formed by dispersing 10 mol % or less of a second organic dye having a light-absorption end at a long wavelength side with respect to a first organic dye as a major constituent. The characteristics required for the first organic dye are, e.g., that carriers injected from the electrode are efficiently recombined, that dye molecules are efficiently excited by the carrier recombination, and that the occurrence of non-radiative recombination process from the excited state is minimized. In addition, it is important for the first organic dye to allow easy thin film formation, and to have high structural and chemical stability. The characteristics required for the second organic dye are that excitation energy can be efficiently received from the first organic dye in the excited state to emit light with a specific wavelength.

In this case, the excited state of the first organic dye is classified into two states, i.e., a singlet and doublet states. It is known that, of these two states, fluorescence from the excited singlet contributes to light emission in the organic EL device. Therefore, a component which easily allows a singlet-singlet excitation energy transfer is preferably selected as the second organic dye. Overlapping of a fluorescent spectrum from the first organic dye and a light-absorption spectrum from the second organic dye is a reference for selection of the second organic dye. In general, the wavelength of the light-absorption end of the second organic dye need only be longer than that of the light-absorption spectrum of the first organic dye.

In the organic EL device, at a room temperature, contribution of phosphorescence emitted from the dye in another excited state, i.e., a triplet state, is not recognized. This is because, a large number of organic dyes do not emit phosphorescence at a normal temperature although they emit phosphorescence at low temperatures. Therefore, it is effective to select a component which receives energy from the first organic dye in the excited triplet state to be excited, and emits phosphorescence or fuoroscence at a normal temperature, as the second organic dye.

The second organic dye dispersed in the first organic dye is not limited to one type, but two or more types of dyes may be dispersed. For example, when an organic dye which receives energy from the first organic dye in the excited singlet state, and an organic dye which receives energy from the excited triplet state are dispersed in the first organic dye, light can be emitted more efficiently. In addition, when a plurality of dye are dispersed in the first organic dye as the second organic dye, light-emission characteristics with many wavelengths can be obtained. More specifically, when the second organic dye is selected, light-emission intensities of red, green, and blue can be controlled, thereby efficiently obtaining white light emission.

The above description will be summarized hereinafter. It is effective to disperse the second organic dye in the first organic dye in order to solve the following problems which occur when an emitting layer is constituted by only on dye. The first problem is that it is difficult to generate phosphorescence from the excited triplet state during a light-emission process in a normal organic dye. The second problem is that if non-emitting sites are present at a rate of at least one per $10^3$ to $10^5$ molecules during the transfer process of the excitation energy, light emission is not observed. The third problem is that when molecules in the excited state are polymerized and stabilized, the light-emission wavelength is shifted to the long wavelength side.

The first problem can be solved by using an organic dye which can emit phosphorescence at a normal temperature as the second organic dye. Therefore, energy from the first organic dye in the excited triplet state can be efficiently utilized. Such organic dyes include, e.g., a dye having a carbonyl group, a dye in which hydrogen is substituted by heavy hydrogen, and a dye containing a heavy element such as a halogen. These substitution groups function to accelerate emission of phosphorescence. However, it is not preferable to add such an organic dye at a high concentration because it causes degeneration of the excited singlet.

The second problem can be solved by dispersing the second organic dye in the first organic dye at a concentration higher than the non-emitting sites. Therefore, the transfer of energy of the first organic dye in an excited state, in particular, an excited singlet state to the non-emitting site can be prevented, and the energy transfer to the second organic dye occurs. As a result, high-efficiency light emission can be achieved.

The third problem can be solved by transferring energy of the first organic dye to the second organic dye before the first organic dye in the excited state is polymerized and stabilized.

When a ratio of the second organic dye in the first organic dye is increased, the above-mentioned second and third problems occur in the dispersed second organic dye itself. The ratio of the second organic dye with respect to the first organic dye must, therefore, be suppressed at a proper value to keep the second organic dye in an isolated state. According to the experiment by the present inventors, if the ratio of the second organic dye with respect to the first organic dye exceeds 10 mol %, the probability of dimerization or polymerization of the excited second organic dye is increased. As a result, the wavelength of the emitted light is shifted toward the long-wavelength side as compared with light emission from the isolated second organic dye. Thus, the ratio of the second organic dye to be dispersed in the first organic dye is preferably suppressed to be 10 mol % or less.

A method for forming a light-emitting layer by dispersing the second dye in the first organic dye is classified into the following two methods. For example, the sublimated and refined first organic dye material is selected for the first organic dye, and the second organic dye material is mixed with the first organic dye material at a ratio of 0.01 to 1 mol %. This mixed material is heated and fused under stirring in a quartz container while an argon gas is added. After the crystals are perfectly mixed with each other, the resultant mixture is relatively quickly cooled and solidified. Using the obtained material, a light-emitting layer is formed by vacuum sublimation.

More specifically, an EL device having a light-emitting layer obtained by dispersing the second organic dye in the first organic dye was manufactured and its characteristics were measured. The structure of the EL device is the same as in FIG. 1, and materials therefor are selected as follows.

First Electrode 2: erbium film
Second Electrode 3: ITO film
First Organic Film 4:

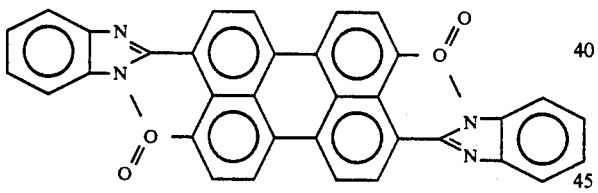

Second Organic Film 5:

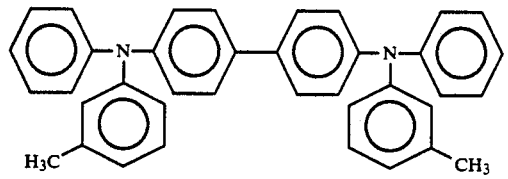

Third Organic Film: 6
First Organic Dye: bipyrenyl
Second Organic Dye: bicoronenyl In the EL device having the light-emitting layer containing such two types of organic dyes, a current of about 4 mA flowed at a DC voltage of 30 V, and light emission with a maximum luminance of 5,000 cd/m$^2$ could be obtained. The light-emission spectrum is slightly shifted toward the long-wavelength side as compared with a case wherein only the first organic dye is used. As a result of measurement of a relationship between an addition amount of the second organic dye and the intensity of light emission, it was found that the addition amount of the second organic dye preferably falls within the range of 0.1 to 1 mol %.

As described above, in order to improve the light-emission luminance, it is effective for the device of other embodiments except for the EL device shown in FIG. 1 to mix two types of organic dyes in the light-emitting layer.

As the second organic dye contained in the light-emitting layer, e.g., (a) a condensed polycyclic aromatic dye consisting of only elements C and H, (b) a condensed polycyclic aromatic dye containing in its skeleton a hetero atom such as O, N, or S besides elements C and H, or (c) a fluorescent dye developed for a dye laser can be used.

The organic dye material used in the present invention will be described hereinafter in detail. In general, the following conditions are required for an organic EL device. That is, (1) high emission efficiency, (2) a high luminance, (3) blue light emission which cannot be obtained in a conventional LED, (4) driving at a low voltage, and the like. Of the above conditions, with regard to the conditions (1) and (2), it is important to optimally select the electronic properties of electron donor-type and electron-acceptor type dyes. As for the condition (3), it is important to select a dye with a large band gap as a dye used for a light-emitting layer. A band gap corresponding to blue light emission ($\lambda=460$ nm) is about 2.7 eV. Since the position of light emission is shifted toward the long-wavelength side from the absorption position, the absorption position of the dye, i.e., a band gap, must be 3 eV or more. As for the condition (4), since a high-intensity electric field must be applied to the organic film, it is important to decrease the thickness of the organic film. However, it is not easy to decrease the thickness of the organic film, and to obtain high reliability of the device at the same time. This is because of the following reason. As described in the above embodiments, the organic EL device is obtained by sequentially stacking organic films on a transparent electrode formed on a transparent substrate, and depositing a metal on the uppermost layer. The organic film normally has a thickness of 100 to 10,000 Å. Vacuum evaporation of the upper electrode is performed under the conditions of a vacuum degree of $10^{-5}$ to $10^{-6}$ Torr, and a temperature of 200° to 300° C. When vacuum evaporation is performed under the above conditions, the organic film which has been formed is affected by heat radiated from an evaporation source or heat transmitted by a flying metal atomic beam. The worst effect is as follows. When the dye has a small molecular weight, its evaporation pressure is high. Therefore, the dye is sublimated again due to the above-mentioned heat to cause defects. In addition, heat fuses the organic film to cause defects, thus undesirably disabling application of a predetermined voltage. When a light-emitting dye such as anthracene, which has a small molecular weight and emits blue light, is used in practice, a production yield of the device is extremely low.

In consideration of the above situation, a polymer obtained by linking two or more dyes each having a band gap of 3 eV or more via a non-conjugated link is preferably used as an organic dye used for an organic EL device. When such a polymer is used, re-sublimation of the organic film during the vacuum evaporation process of electrodes can be prevented. In addition, the molecular weight of each organic dye used for a light-emitting layer is preferably 400 or more. This is based on the finding obtained by measuring evaporation pressures of various condensed cyclic aromatic dyes having different molecular weights under the conditions of a vacuum degree of $10^{-5}$ to $10^{-6}$ Torr, and a temperature of 200° to 300° C. upon formation of the upper electrode. In this case, the evaporation pressures are slightly different from each other depending on a method of linking a benzene ring even if the molecular weights are equal to each other. However, a relationship between a molecular weight M and an evaporation pressure P substantially satisfies the following equation:

$$\log P = -B \cdot M/T + C$$

where T is the temperature, and B and C are constants.

It was found in accordance with the experimental result that the evaporation pressure of a dye having a molecular weight of 400 or more was $10^{-5}$ to $10^{-6}$ Torr at 200° to 300° C.

Various molecules can be used as such a dye molecule having a large molecular weight. In order to satisfy all the above-mentioned conditions (1) to (4), however, a molecular structure must be taken into consideration. For example, a derivative of a condensed polycyclic aromatic molecule having an increased $\pi$ electronic conjugated system can be exemplified as a dye molecule with a large molecular weight. In general, these dyes are of an electron donor type. Therefore, these dyes are used for hole transport layers. In order to use a derivative of a condensed polycyclic aromatic molecule as an electron movement layer, an aromatic skeleton is derived to have a quinoid structure, or a netro-, cyano-, or halogen-group is introduced to impart an electron acceptor property. In addition, a polyphiline metal complex and a phthalocyanine metal complex are known as dye molecules with a large molecular weight.

It is, however, a difficult to emit blue light in a dye molecule having a large condensed polycyclic aromatic molecule as a basic skeleton, or a dye molecule having a polyphiline metal complex or a phthalocyanine metal complex as a basic skeleton. In addition, the synthesis of the dye molecules, and control of the electron acceptor or electron donor property are also difficult. In order to solve these problems, a polymer obtained by linking two or more organic dyes each having a band gap of 2.6 eV or more via a non-conjugated link may be used. In this case, an organic dye with a band gap of 2.6 eV or more serving as a monomer may have a molecular weight of 100 to 400. A non-conjugated link for linking these organic dyes includes a carbon-carbon link, a hydrocarbon residue, an ester link, a carbonyl residue, an amide link, and an ether link. These organic dyes may be linked to a straight chain polymer in a pendant-like manner, in this case, the non-conjugated link is a repeating unit which constitutes a straight chain.

Examples of the light-emitting organic dyes each consisting of a polymer obtained by combining two ore more organic dyes with a band gap of 2.6 eV or more via a non-conjugated link are shown in tables 1 to 6. Tables 1 and 2 respectively show examples of a light-emitting donor-type and acceptor-type organic dyes each having a non-conjugated link of a carbon-carbon single link or hydrocarbon residue (=CH—CH=). Tables 3 and 4 respectively show a donor and an acceptor each serving as a monomer which constitutes a light-emitting organic dye. Table 5 shows examples of combinations of, e.g., an ester link, a carbonyl residue, an amide link, and an ether link as non-conjugated links.

In Table 5, reference symbol R denotes a donor or an acceptor. Table 6 shows examples of light-emitting organic dyes obtained by linking the donor or acceptor R with a straight chain polymer serving as a monomer in a pendant-like manner.

TABLE 1

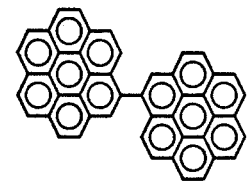

$C_{48}H_{22}$
bicoronenyl

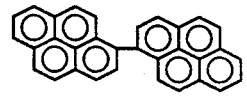

$C_{32}H_{18}$
bipyrenyl

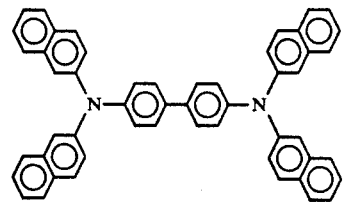

tetranaphthyl benzidine

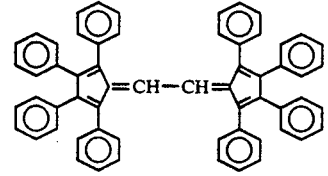

bis(tetraphenyl cyclopentadienylidene)ethene

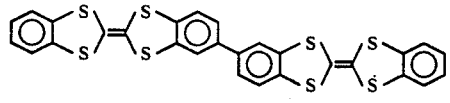

bidibenzotetrathiafluvalenyl

TABLE 2

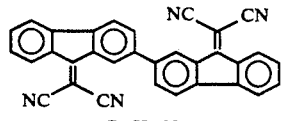

$C_{30}H_{14}N_4$
bidicyanomethylenefluorenyl

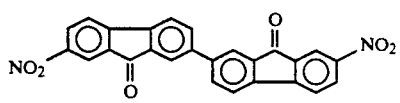

$C_{26}H_{10}N_2O_4$
dinitrobifluorenonyl

TABLE 2-continued

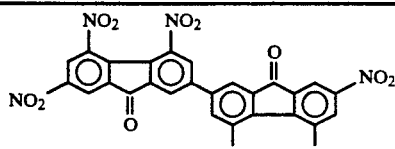
$C_{26}H_8N_6O_{14}$
hexanitrobifluorenonyl

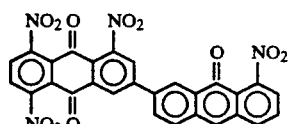
$C_{28}H_8N_6O_{16}$
hexanitrobiantraquinonyl

TABLE 3

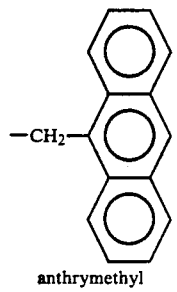
anthrymethyl

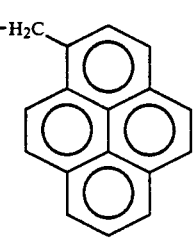
pyrenylmethyl

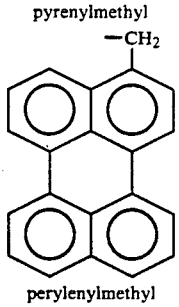
perylenylmethyl

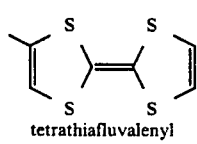
tetrathiafluvalenyl

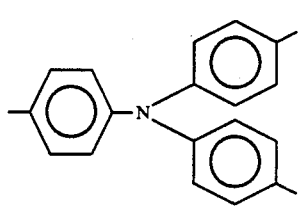

TABLE 3-continued

N,N-diphenylaminophenyl

TABLE 4

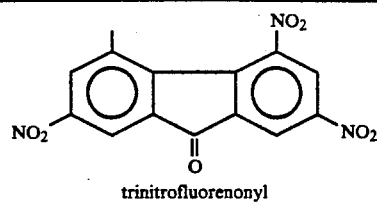
trinitrofluorenonyl

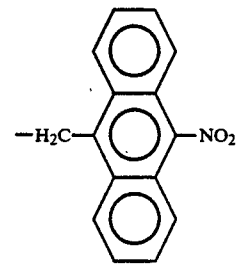
nitroanthrylmethyl

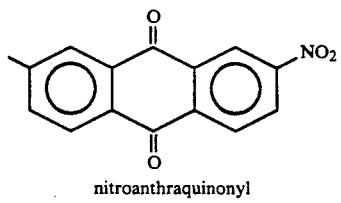
nitroanthraquinonyl

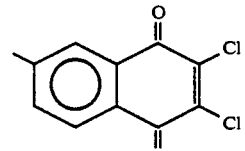
dichloronaphtoquinonyl

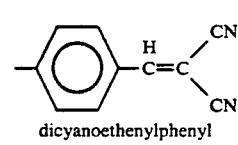
dicyanoethenylphenyl

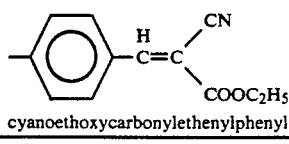
cyanoethoxycarbonylethenylphenyl

TABLE 5

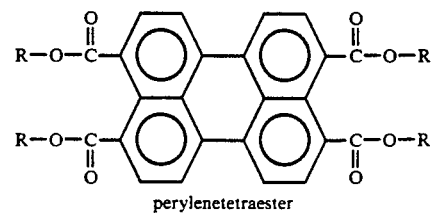
perylenetetraester

TABLE 5-continued

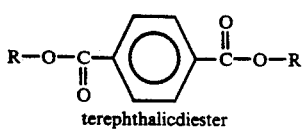
terephthalicdiester

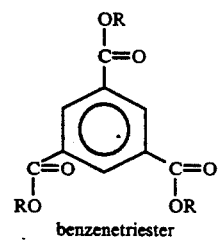
benzenetriester

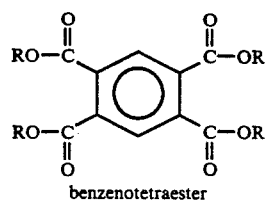
benzenotetraester

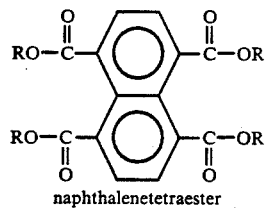
naphthalenetetraester

The following non-conjugated links can be substituted for ester link

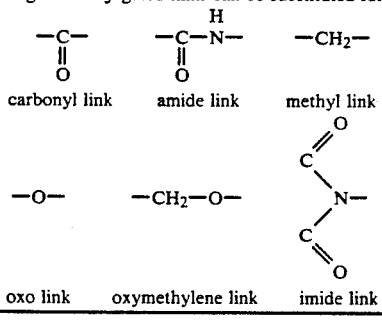

TABLE 6

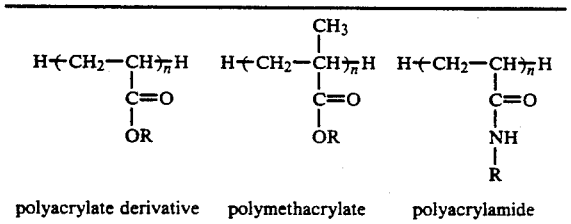
polyacrylate derivative    polymethacrylate    polyacrylamide

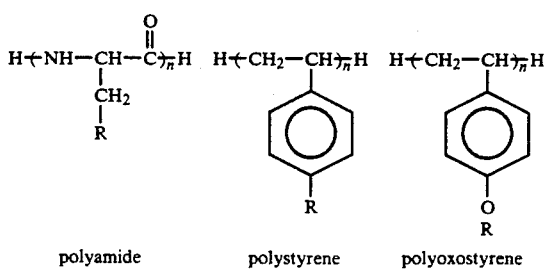
polyamide    polystyrene    polyoxostyrene

TABLE 6-continued $n = 3 \sim 10$

In the above embodiments, an erbium (Er) film and a ytterbium (Yb) film are used as the first electrode which injects electrons into the organic films. In the organic EL device according to the present invention, the following properties are required for the first electrode. That is, easy injection of electrons into the organic film, i.e., a small work function, easy vacuum evaporation, high chemical stability, and the like. From such viewpoints, other rare earth elements such as neodymium (Nd) and gadolinium (Gd) can be used as the first electrode.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An organic electroluminescent device comprising:
   a multi-layered body including first and second organic semiconductor layers having a junction interface therebetween, at least one of said first and second organic semiconductor layers serving as a light-emitting layer;
   a first electrode electrically coupled to said first organic semiconductor layer, for injecting a first kind of change carrier into said first organic semiconductor layer;
   a second electrode electrically coupled to said second organic semiconductor layer, for injecting a second kind of charge carrier into said second organic semiconductor layer; and
   carrier-recombination accelerator means for forming blocking barriers in the junction interface of said first and second organic semiconductor layers, and for causing the first and second kinds of charge carriers to be blocked by the blocking barriers in said junction interface, whereby the first and second charge carriers are facilitated to be recombined with each other.

2. An organic electroluminescent device according to claim 1, wherein said carrier-recombination accelerator means comprises:
   first means for forming a first blocking barrier for blocking a flow of the first charge carrier being injected into said first organic semiconductor layer; and
   second means for forming a second blocking barrier for blocking a flow of the second charge carrier being injected into said second organic semiconductor layer.

3. An organic electroluminescent device according to claim 2, wherein said carrier-recombination accelerator means comprises:
   bias supply means for applying a biasing voltage between said first and second electrodes, for causing the first charge carrier injected into said first organic semiconductor layer and the second charge carrier injected into said second organic semiconductor layer to be accumulated in said junction interface to form an electric double layer, and for causing at least one of the first and second charge carriers constituting the electrical double layer to tunnel the blocking barrier at a predetermined threshold voltage and to be recombined with the other of said first and second charge carriers.

4. An organic electroluminescent device according to claim 3, wherein said first charge carrier includes electrons, and said second charge carrier includes holes, said bias supply means causing said second electrode to be at a positive potential while the biasing voltage is applied between said first and second electrodes.

5. An organic electroluminescent device according to claim 1, wherein said multi-layered body includes:

said first organic semiconductor layer, serving as a first light-emitting layer, in constant with said first electrode; and said second organic semiconductor layer, serving as a second light-emitting layer, in contact with said second electrode, electrons injected from said first electrode into said first organic semiconductor layer and holes injected from said second electrode into said second organic semiconductor layer are accumulated at a blocking barrier junction between said first and second organic semiconductor layers when a biasing voltage is applied between said first and second electrodes to set said second electrode at a positive potential, and of the accumulated electrons and holes, the electrons are tunnel-injected into said second organic semiconductor layer at a first threshold voltage to perform radiative recombination in said second organic semiconductor layer, and the holes are tunnel-injected into said first organic semiconductor layer at a second threshold voltage different from the first threshold voltage to perform radiative recombination in said first organic semiconductor layer.

6. An organic electroluminescent device according to claim 1, wherein said multi-layered body includes:

said first organic semiconductor layer in contact with said first electrode;

said second organic semiconductor layer, serving as a first light-emitting layer, in contact with said first organic semiconductor layer; and a third organic semiconductor layer, serving as a second light-emitting layer, sandwiched between said second organic semiconductor layer and said second electrode, electrons injected from said first electrode into said first organic semiconductor layer and holes injected from said second electrode into said second organic semiconductor layer through said third organic semiconductor layer are accumulated at a blocking barrier junction between said first and second organic semiconductor layers when a biasing voltage is applied between said first and second electrodes to set said second electrode at a positive potential, and of the accumulated electrons and holes, the electrons are tunnel-injected into said second organic semiconductor layer at a first threshold voltage to perform radiative recombination in said second organic semiconductor layer, and are transported to said third organic semiconductor layer at a second threshold voltage to perform radiative recombination in said third organic semiconductor layer.

7. An organic electroluminescent device according to claim 1, wherein said multi-layered body includes:

said first organic semiconductor layer serving as a first light-emitting layer;

said second organic semiconductor layer sandwiched between said first organic semiconductor layer and said second electrode; and a third organic semiconductor layer, serving as a second light-emitting layer, sandwiched between said first organic semiconductor layer and said first electrode, and electrons injected from said first electrode into said first organic semiconductor layer through said third organic semiconductor layer and holes injected from said second electrode into said second organic semiconductor layer are accumulated at a blocking barrier junction between said first and second organic semiconductor layers when a biasing voltage is applied between said first and second electrodes to set said second electrode at a positive potential, and of the accumulated electrons and holes, the holes are tunnel-injected into said first organic semiconductor layer at a first threshold voltage to perform radiative recombination in said first organic semiconductor layer, and are transported to said third organic semiconductor layer at a second threshold voltage to perform radiative recombination in said third organic semiconductor layer.

* * * * *